(12) United States Patent
Moon

(10) Patent No.: US 7,890,896 B2
(45) Date of Patent: Feb. 15, 2011

(54) METHOD AND APPARATUS FOR DISTINGUISHING COMBINATIONAL DESIGNS

(75) Inventor: In-Ho Moon, Portland, OR (US)

(73) Assignee: Synopsys, Inc., Mountain View, CA (US)

(*) Notice: Subject to any disclaimer, the term of this patent is extended or adjusted under 35 U.S.C. 154(b) by 1243 days.

(21) Appl. No.: 11/282,883

(22) Filed: Nov. 18, 2005

(65) Prior Publication Data
US 2007/0118339 A1 May 24, 2007

(51) Int. Cl.
*G06F 17/50* (2006.01)
(52) U.S. Cl. .................. 716/3; 716/4; 716/5; 716/6; 703/2; 703/13
(58) Field of Classification Search .......... 716/3–6; 703/2, 13; 717/104, 122
See application file for complete search history.

(56) References Cited

U.S. PATENT DOCUMENTS

| | | | |
|---|---|---|---|
| 6,993,730 B1* | 1/2006 | Higgins et al. ............... | 716/3 |
| 7,240,311 B2* | 7/2007 | Lai et al. ..................... | 716/5 |
| 2004/0015799 A1* | 1/2004 | Jain ............................ | 716/5 |
| 2005/0155002 A1* | 7/2005 | Lai et al. ..................... | 716/3 |
| 2006/0225008 A1* | 10/2006 | Schleicher et al. .......... | 716/3 |

OTHER PUBLICATIONS

"Non-miter-based Combinational Equivalence Checking by Comparing BDDs with different Variable Orders", by In-Ho Moon and Carl Pixley, FMCAD 2004 p. 144-158, @2004—Nov. 15, 2004.*
"Graph-Based Algorithms for Boolean Function Manipulation", by Bryant, R.E.;Computers, IEEE Transactions onvol. C-35, Issue 8, Aug. 1986 pp. 677-691.*

* cited by examiner

*Primary Examiner*—Thuan Do
*Assistant Examiner*—Nha T Nguyen
(74) *Attorney, Agent, or Firm*—Park, Vaughan, Fleming & Dowler LLP

(57) ABSTRACT

Ordinary minterm counting (OMC) and weighted minterm counting (WMC) are applied as combinational design discriminators to a pair of combinational designs D1 and D2. OMC assigns the same weight to each minterm, while WMC assigns a weight that can vary. For application of minterm counting, D1 and D2 can be converted into BDDs. The size of the BDDs can be reduced by assigning binary values to some of the input variables. If the minterm counts of D1 and D2 are within a certain tolerance, then D1 and D2 cannot be distinguished. Even if D1 and D2 are determined to represent different functionalities, they may still be sufficiently related such that classification of them as differing functionalities is inappropriate. Each such test of relatedness, between a pair of designs D1 and D2, can be referred to as an "exception." Minterm counting can also be applied when don't cares are part of a design specification. Exceptions can apply to such minterm counts.

24 Claims, 33 Drawing Sheets

APPLICATION OF MINTERM COUNTING WITHOUT DON'T CARES

APPLICATION OF MINTERM COUNTING WITHOUT DON'T CARES

APPLICATION OF MINTERM COUNTING WITH DON'T CARES

Figure 2A
OMC = 5

| $v_1 v_2$ / $v_0$ | 00 | 01 | 11 | 10 |
|---|---|---|---|---|
| 0 |  |  |  | 1 |
| 1 | 1 | 1 | 1 | 1 |

Figure 2B
WMC = 43

| $v_1 v_2$ / $v_0$ | 00 | 01 | 11 | 10 |
|---|---|---|---|---|
| 0 |  |  |  | 3 |
| 1 | 2 | 8 | 24 | 6 |

FIGURE 3A

PARENT WMC FROM "THEN" AND "ELSE" INPUTS TO PARENT $$wmc(nd_p) = \frac{\left[\begin{array}{l}\left(wmc\_t(nd_p) \times v2wt(nd2v(nd_p))\right) + \\ \left(wmc\_e(nd_p)\right)\end{array}\right]}{2}$$

FIGURE 3B

FINDING "THEN" INPUT TO PARENT if $nd_{then} = 1$:
$\quad wmc\_t(nd_p) = 2^n \times p2con\_adj\_fac(nd2v(nd_p))$
if $nd_{then} \neq 1$:
$\quad wmc\_t(nd_p) = wmc(nd_{then}) \times$
$\quad\quad p2chi\_adj\_fac(nd2v(nd_p), nd2v(nd_{then}))$

FIGURE 3C

FINDING "ELSE" INPUT TO PARENT if $nd_{else} = 1$ and $inv\_edge(nd_p, nd_{else})$:
$\quad wmc\_e(nd_p) = 0$
if $nd_{else} = 1$ and $not(inv\_edge(nd_p, nd_{else}))$:
$\quad wmc\_e(nd_p) = 2^n \times p2con\_adj\_fac(nd2v(nd_p))$
if $nd_{else} \neq 1$ and $not(inv\_edge(nd_p, nd_{else})), wmc\_e(nd_p) =$
$\quad wmc(nd_{else}) \times p2chi\_adj\_fac(nd2v(nd_p), nd2v(nd_{else}))$
if $nd_{else} \neq 1$ and $inv\_edge(nd_p, nd_{else}), wmc\_e(nd_p) =$
$\quad \left[2^n \times p2con\_adj\_fac(nd2v(nd_p))\right] -$
$\quad \left[wmc(nd_{else}) \times p2chi\_adj\_fac(nd2v(nd_p), nd2v(nd_{else}))\right]$

FIGURE 3D

PARENT TO CONSTANT NODE ADJUSTMENT FACTOR if $i = n-1: p2con\_adj\_fac(i) = 1$
if $i < n-1: p2con\_adj\_fac(i) = \prod_{k=i+1}^{k=n-1}\left[\frac{(v2wt(v_k)+1)}{2}\right]$

FIGURE 3E

PARENT TO CHILD NODE ADJUSTMENT FACTOR if $(j-i) = 1: p2chi\_adj\_fac(i,j) = 1$
if $(j-i) > 1: p2chi\_adj\_fac(i,j) = \prod_{k=i+1}^{k=j-1}\left[\frac{(v2wt(v_k)+1)}{2}\right]$

Figure 4A

```
1   find_wmc (cur_node)
2   {
3   if (cur_node represents constant "1") return;
4
5   then_wmc = find_then_wmc (cur_node);
6   else_wmc = find_else_wmc (cur_node);
7   cur_node_level = find_node_level (cur_node);
8   cur_node_wt = find_weight (cur_node_level);
9
10  cur_node_wmc =
11          (then_wmc * cur_node_wt + else_wmc) / 2 ;
12
13  } /* end "find_wmc" */
14
```

Figure 4B

```
1    find_then_wmc (cur_node)
2    {
3    then_node = find_then_node (cur_node);
4
5    if (then_node == constant "1")
6    {
7            then_wmc_for_full_bdd = $2^n$;
8            adj_fac = find_adj_fac_n (cur_node);
9            then_wmc = then_wmc_for_full_bdd * adj_fac;
10           return then_wmc;
11   }
12
13   then_wmc = find_wmc (then_node);
14   adj_fac = find_adj_fac_child (cur_node, then_node);
15   then_wmc = then_wmc * adj_fac;
16   return then_wmc;
17
18   } /* end "find_then_wmc" */
```

Figure 4C

```
1   find_else_wmc (cur_node)
2   {
3   else_node = find_else_node (cur_node);
4   edge_inv = find_edge_type (cur_node, else_node);
5
6   if (else_node == constant "1")
7   {
8           if (edge_inv)
9           {
10                  else_wmc = 0;
11                  return else_wmc;
12          }
13
14          else_wmc_for_full_bdd = $2^n$;
15          adj_fac = find_adj_fac_n (cur_node);
16          else_wmc = else_wmc_for_full_bdd * adj_fac;
17          return else_wmc;
18  }
19
20  else_wmc = find_wmc (else_node);
21  adj_fac = find_adj_fac_child (cur_node, else_node);
22  else_wmc = else_wmc * adj_fac;
23
24  if (edge_inv)
25  {
26          constant_one_wmc_for_full_bdd = $2^n$;
27          adj_fac = find_adj_fac_n (cur_node);
28          constant_one_wmc = constant_one_wmc_for_full_bdd * adj_fac;
29
30          inv_else_wmc = constant_one_wmc - else_wmc;
31          return inv_else_wmc;
32  }
33  else
34          return else_wmc;
35
36  } /* end "find_else_wmc" */
```

Figure 4D

```
1    find_adj_fac_n (cur_node)
2    {
3
4        adj_fac = 1;
5
6        cur_level = find_node_level (cur_node) + 1;
7
8        while (cur_level < n)
9        {
10           cur_wt = find_weight (cur_level);
11           adj_fac = adj_fac * ( (cur_wt + 1) / 2);
12           cur_level = cur_level + 1;
13       }
14
15       return adj_fac;
16   }
```

Figure 4E

```
1   find_adj_fac_child (cur_node, chi_node)
2   {
3
4       adj_fac = 1;
5
6       cur_level = find_node_level (cur_node) + 1;
7       chi_level = find_node_level (chi_node);
8
9       while (cur_level < chi_level)
10      {
11              cur_wt = find_weight (cur_level);
12              adj_fac = adj_fac * ( (cur_wt + 1) / 2);
13              cur_level = cur_level + 1;
14      }
15
16      return adj_fac;
17  }
18
```

FIGURE 6A
OMC, Output Inversion if $omc(D1) = omc(-D2)$ then
keep $D1$ and $D2$ in same EC

FIGURE 6B
OMC, Output Inversion,
Finding OMC of -D2

$omc(-D2) = 2^n - omc(D2)$

FIGURE 6C  OMC, Input Inversion for $n$ variables $v_0$ to $v_{n-1}$, with $k$ to be tested for input inversion, test whether all of the following expressions are true:

$$\begin{bmatrix} omc(cofac(D1,v_0)) = omc(cofac(D2,-v_0)) \text{ AND} \\ omc(cofac(D1,-v_0)) = omc(cofac(D2,v_0)) \end{bmatrix} \text{ AND}$$

$$\begin{bmatrix} omc(cofac(D1,v_1)) = omc(cofac(D2,-v_1)) \text{ AND} \\ omc(cofac(D1,-v_1)) = omc(cofac(D2,v_1)) \end{bmatrix} \text{ AND}$$

...

$$\begin{bmatrix} omc(cofac(D1,v_{k-1})) = omc(cofac(D2,-v_{k-1})) \text{ AND} \\ omc(cofac(D1,-v_{k-1})) = omc(cofac(D2,v_{k-1})) \end{bmatrix}$$

FIGURE 6D  OMC, Output Inversion and Input Inversion for $n$ variables $v_0$ to $v_{n-1}$, with $k$ to be tested for input inversion, test whether all of the following expressions are true:

$$\begin{bmatrix} omc(cofac(D1,v_0)) = omc(cofac(-D2,-v_0)) \text{ AND} \\ omc(cofac(D1,-v_0)) = omc(cofac(-D2,v_0)) \end{bmatrix} \text{ AND}$$

$$\begin{bmatrix} omc(cofac(D1,v_1)) = omc(cofac(-D2,-v_1)) \text{ AND} \\ omc(cofac(D1,-v_1)) = omc(cofac(-D2,v_1)) \end{bmatrix} \text{ AND}$$

...

$$\begin{bmatrix} omc(cofac(D1,v_{k-1})) = omc(cofac(-D2,-v_{k-1})) \text{ AND} \\ omc(cofac(D1,-v_{k-1})) = omc(cofac(-D2,v_{k-1})) \end{bmatrix}$$

FIGURE 7A
WMC, Output Inversion if $wmc(D1) = wmc(-D2)$ then
keep $D1$ and $D2$ in same EC

FIGURE 7B
WMC, Output Inversion, Finding WMC of -D2

$wmc(-D2) = \text{wmc\_constant\_1\_design}(\text{numVars}(D2)) - wmc(D2)$ $\text{wmc\_constant\_1\_design}(n) = 2^n \times \prod_{i=0}^{i=n-1}\left[\dfrac{v2wt(i)+1}{2}\right]$

FIGURE 7C  WMC, Input Inversion for $n$ variables $v_0$ to $v_{n-1}$, with $k$ to be tested for input inversion,
test whether all of the following expressions are true:

$\begin{bmatrix} wmc(cofac(D1,v_0)) = wmc\_ps(cofac(D2,-v_0),v_0,v_1,...v_{k-1}) \text{ AND} \\ wmc(cofac(D1,-v_0)) = wmc\_ps(cofac(D2,v_0),v_0,v_1,...v_{k-1}) \end{bmatrix}$ AND $\begin{bmatrix} wmc(cofac(D1,v_1)) = wmc\_ps(cofac(D2,-v_1),v_0,v_1,...v_{k-1}) \text{ AND} \\ wmc(cofac(D1,-v_1)) = wmc\_ps(cofac(D2,v_1),v_0,v_1,...v_{k-1}) \end{bmatrix}$ AND

...

$\begin{bmatrix} wmc(cofac(D1,v_{k-1})) = wmc\_ps(cofac(D2,-v_{k-1}),v_0,v_1,...v_{k-1}) \text{ AND} \\ wmc(cofac(D1,-v_{k-1})) = wmc\_ps(cofac(D2,v_{k-1}),v_0,v_1,...v_{k-1}) \end{bmatrix}$

FIGURE 7D  WMC, Output Inversion and Input Inversion for $n$ variables $v_0$ to $v_{n-1}$, with $k$ to be tested for input inversion,
test whether all of the following expressions are true:

$\begin{bmatrix} wmc(cofac(D1,v_0)) = wmc\_ps(cofac(-D2,-v_0),v_0,v_1,...v_{k-1}) \text{ AND} \\ wmc(cofac(D1,-v_0)) = wmc\_ps(cofac(-D2,v_0),v_0,v_1,...v_{k-1}) \end{bmatrix}$ AND $\begin{bmatrix} wmc(cofac(D1,v_1)) = wmc\_ps(cofac(-D2,-v_1),v_0,v_1,...v_{k-1}) \text{ AND} \\ wmc(cofac(D1,-v_1)) = wmc\_ps(cofac(-D2,v_1),v_0,v_1,...v_{k-1}) \end{bmatrix}$ AND

...

$\begin{bmatrix} wmc(cofac(D1,v_{k-1})) = wmc\_ps(cofac(-D2,-v_{k-1}),v_0,v_1,...v_{k-1}) \text{ AND} \\ wmc(cofac(D1,-v_{k-1})) = wmc\_ps(cofac(-D2,v_{k-1}),v_0,v_1,...v_{k-1}) \end{bmatrix}$

FIGURE 8A
OMC, Output Inversion
and Don't Cares $$if \left( \begin{array}{l} [omc(D1_{min}) = omc(-D2 \wedge -D1_{dc})] \\ AND \\ [omc(D1_{min}) \leq omc(-D2) \leq omc(D1_{max})] \end{array} \right)$$

then keep $D1$ and $D2$ in same EC

FIGURE 8B
WMC, Output Inversion
and Don't Cares $$if \left( \begin{array}{l} [wmc(D1_{min}) = wmc(-D2 \wedge -D1_{dc})] \\ AND \\ [wmc(D1_{min}) \leq wmc(-D2) \leq wmc(D1_{max})] \end{array} \right)$$

then keep $D1$ and $D2$ in same EC

FIGURE 9A  OMC, Input Inversion and Don't Cares for $n$ variables $v_0$ to $v_{n-1}$, with $k$ to be tested for input inversion, test whether all of the following expressions are true:

$$\left[\left(\begin{bmatrix} omc(cofac(D1_{\min}, v_0)) = \\ omc(cofac(D2, -v_0) \wedge sub(-D1_{dc}, v_0, v_1, \ldots v_{k-1})) \end{bmatrix} AND \begin{bmatrix} omc(cofac(D1_{\min}, -v_0)) = \\ omc(cofac(D2, v_0) \wedge sub(-D1_{dc}, v_0, v_1, \ldots v_{k-1})) \end{bmatrix}\right) AND \left(\begin{bmatrix} omc(cofac(D1_{\min}, -v_0)) \leq omc(cofac(D2, v_0)) \\ \leq omc(cofac(D1_{\max}, -v_0)) \end{bmatrix} AND \begin{bmatrix} omc(cofac(D1_{\min}, v_0)) \leq omc(cofac(D2, -v_0)) \\ \leq omc(cofac(D1_{\max}, v_0)) \end{bmatrix}\right)\right] AND$$

$$\left[\left(\begin{bmatrix} omc(cofac(D1_{\min}, v_1)) = \\ omc(cofac(D2, -v_1) \wedge sub(-D1_{dc}, v_0, v_1, \ldots v_{k-1})) \end{bmatrix} AND \begin{bmatrix} omc(cofac(D1_{\min}, -v_1)) = \\ omc(cofac(D2, v_1) \wedge sub(-D1_{dc}, v_0, v_1, \ldots v_{k-1})) \end{bmatrix}\right) AND \left(\begin{bmatrix} omc(cofac(D1_{\min}, -v_1)) \leq omc(cofac(D2, v_1)) \\ \leq omc(cofac(D1_{\max}, -v_1)) \end{bmatrix} AND \begin{bmatrix} omc(cofac(D1_{\min}, v_1)) \leq omc(cofac(D2, -v_1)) \\ \leq omc(cofac(D1_{\max}, v_1)) \end{bmatrix}\right)\right] AND$$

$\ldots$ $$\left[\left(\begin{bmatrix} omc(cofac(D1_{\min}, v_{k-1})) = \\ omc(cofac(D2, -v_{k-1}) \wedge sub(-D1_{dc}, v_0, v_1, \ldots v_{k-1})) \end{bmatrix} AND \begin{bmatrix} omc(cofac(D1_{\min}, -v_{k-1})) = \\ omc(cofac(D2, v_{k-1}) \wedge sub(-D1_{dc}, v_0, v_1, \ldots v_{k-1})) \end{bmatrix}\right) AND \left(\begin{bmatrix} omc(cofac(D1_{\min}, -v_{k-1})) \leq omc(cofac(D2, v_{k-1})) \\ \leq omc(cofac(D1_{\max}, -v_{k-1})) \end{bmatrix} AND \begin{bmatrix} omc(cofac(D1_{\min}, v_{k-1})) \leq omc(cofac(D2, -v_{k-1})) \\ \leq omc(cofac(D1_{\max}, v_{k-1})) \end{bmatrix}\right)\right]$$

FIGURE 9B  WMC, Input Inversion and Don't Cares for $n$ variables $v_0$ to $v_{n-1}$, with $k$ to be tested for input inversion,
test whether all of the following expressions are true:

$$\left[\left(\begin{bmatrix} wmc(cofac(D1_{min},v_0)) = \\ wmc\_ps([cofac(D2,-v_0) \wedge sub(-D1_{dc},v_0,v_1,...v_{k-1})],v_0,v_1,...v_{k-1}) \end{bmatrix} AND \right.\right.$$
$$\left.\left.\begin{bmatrix} wmc(cofac(D1_{min},-v_0)) = \\ wmc\_ps([cofac(D2,v_0) \wedge sub(-D1_{dc},v_0,v_1,...v_{k-1})],v_0,v_1,...v_{k-1}) \end{bmatrix}\right) AND \right.$$
$$\left.\left(\begin{bmatrix} wmc(cofac(D1_{min},-v_0)) \leq wmc\_ps(cofac(D2,v_0),v_0,v_1,...v_{k-1}) \\ \leq wmc(cofac(D1_{max},-v_0)) \end{bmatrix} AND \right.\right.$$
$$\left.\left.\begin{bmatrix} wmc(cofac(D1_{min},v_0)) \leq wmc\_ps(cofac(D2,-v_0),v_0,v_1,...v_{k-1}) \\ \leq wmc(cofac(D1_{max},v_0)) \end{bmatrix}\right)\right] AND$$

$$\left[\left(\begin{bmatrix} wmc(cofac(D1_{min},v_1)) = \\ wmc\_ps([cofac(D2,-v_1) \wedge sub(-D1_{dc},v_0,v_1,...v_{k-1})],v_0,v_1,...v_{k-1}) \end{bmatrix} AND \right.\right.$$
$$\left.\left.\begin{bmatrix} wmc(cofac(D1_{min},-v_1)) = \\ wmc\_ps([cofac(D2,v_1) \wedge sub(-D1_{dc},v_0,v_1,...v_{k-1})],v_0,v_1,...v_{k-1}) \end{bmatrix}\right) AND \right.$$
$$\left.\left(\begin{bmatrix} wmc(cofac(D1_{min},-v_1)) \leq wmc\_ps(cofac(D2,v_1),v_0,v_1,...v_{k-1}) \\ \leq wmc(cofac(D1_{max},-v_1)) \end{bmatrix} AND \right.\right.$$
$$\left.\left.\begin{bmatrix} wmc(cofac(D1_{min},v_1)) \leq wmc\_ps(cofac(D2,-v_1),v_0,v_1,...v_{k-1}) \\ \leq wmc(cofac(D1_{max},v_1)) \end{bmatrix}\right)\right] AND$$

$$\cdots$$

$$\left[\left(\begin{bmatrix} wmc(cofac(D1_{min},v_{k-1})) = \\ wmc\_ps([cofac(D2,-v_{k-1}) \wedge sub(-D1_{dc},v_0,v_1,...v_{k-1})],v_0,v_1,...v_{k-1}) \end{bmatrix} AND \right.\right.$$
$$\left.\left.\begin{bmatrix} wmc(cofac(D1_{min},-v_{k-1})) = \\ wmc\_ps([cofac(D2,v_{k-1}) \wedge sub(-D1_{dc},v_0,v_1,...v_{k-1})],v_0,v_1,...v_{k-1}) \end{bmatrix}\right) AND \right.$$
$$\left.\left(\begin{bmatrix} wmc(cofac(D1_{min},-v_{k-1})) \leq wmc\_ps(cofac(D2,v_{k-1}),v_0,v_1,...v_{k-1}) \\ \leq wmc(cofac(D1_{max},-v_{k-1})) \end{bmatrix} AND \right.\right.$$
$$\left.\left.\begin{bmatrix} wmc(cofac(D1_{min},v_{k-1})) \leq wmc\_ps(cofac(D2,-v_{k-1}),v_0,v_1,...v_{k-1}) \\ \leq wmc(cofac(D1_{max},v_{k-1})) \end{bmatrix}\right)\right]$$

FIGURE 10A OMC, Input Inversion, Output Inversion and Don't Cares for $n$ variables $v_0$ to $v_{n-1}$, with $k$ to be tested for input inversion, test whether all of the following expressions are true:

$$\left[\begin{array}{l}\left(\begin{array}{l}\left[\begin{array}{l}omc(cofac(D1_{min},v_0))=\\ omc(cofac(-D2,-v_0)\wedge sub(-D1_{dc},v_0,v_1,...v_{k-1}))\end{array}\right]AND\\ \left[\begin{array}{l}omc(cofac(D1_{min},-v_0))=\\ omc(cofac(-D2,v_0)\wedge sub(-D1_{dc},v_0,v_1,...v_{k-1}))\end{array}\right]\end{array}\right)AND\\ \left(\begin{array}{l}\left[\begin{array}{l}omc(cofac(D1_{min},-v_0))\le omc(cofac(-D2,v_0))\\ \le omc(cofac(D1_{max},-v_0))\end{array}\right]AND\\ \left[\begin{array}{l}omc(cofac(D1_{min},v_0))\le omc(cofac(-D2,-v_0))\\ \le omc(cofac(D1_{max},v_0))\end{array}\right]\end{array}\right)\end{array}\right]AND$$

$$\left[\begin{array}{l}\left(\begin{array}{l}\left[\begin{array}{l}omc(cofac(D1_{min},v_1))=\\ omc(cofac(-D2,-v_1)\wedge sub(-D1_{dc},v_0,v_1,...v_{k-1}))\end{array}\right]AND\\ \left[\begin{array}{l}omc(cofac(D1_{min},-v_1))=\\ omc(cofac(-D2,v_1)\wedge sub(-D1_{dc},v_0,v_1,...v_{k-1}))\end{array}\right]\end{array}\right)AND\\ \left(\begin{array}{l}\left[\begin{array}{l}omc(cofac(D1_{min},-v_1))\le omc(cofac(-D2,v_1))\\ \le omc(cofac(D1_{max},-v_1))\end{array}\right]AND\\ \left[\begin{array}{l}omc(cofac(D1_{min},v_1))\le omc(cofac(-D2,-v_1))\\ \le omc(cofac(D1_{max},v_1))\end{array}\right]\end{array}\right)\end{array}\right]AND$$

$$...$$

$$\left[\begin{array}{l}\left(\begin{array}{l}\left[\begin{array}{l}omc(cofac(D1_{min},v_{k-1}))=\\ omc(cofac(-D2,-v_{k-1})\wedge sub(-D1_{dc},v_0,v_1,...v_{k-1}))\end{array}\right]AND\\ \left[\begin{array}{l}omc(cofac(D1_{min},-v_{k-1}))=\\ omc(cofac(-D2,v_{k-1})\wedge sub(-D1_{dc},v_0,v_1,...v_{k-1}))\end{array}\right]\end{array}\right)AND\\ \left(\begin{array}{l}\left[\begin{array}{l}omc(cofac(D1_{min},-v_{k-1}))\le omc(cofac(-D2,v_{k-1}))\\ \le omc(cofac(D1_{max},-v_{k-1}))\end{array}\right]AND\\ \left[\begin{array}{l}omc(cofac(D1_{min},v_{k-1}))\le omc(cofac(-D2,-v_{k-1}))\\ \le omc(cofac(D1_{max},v_{k-1}))\end{array}\right]\end{array}\right)\end{array}\right]$$

FIGURE 10B  WMC, Input Inversion, Output Inversion and Don't Cares for $n$ variables $v_0$ to $v_{n-1}$, with $k$ to be tested for input inversion,
test whether all of the following expressions are true:

$$\begin{bmatrix} \begin{pmatrix} \begin{bmatrix} wmc(cofac(D1_{min},v_0)) = \\ wmc\_ps([cofac(-D2,-v_0) \wedge sub(-D1_{dc},v_0,v_1,...v_{k-1})],v_0,v_1,...v_{k-1}) \end{bmatrix} AND \\ \begin{bmatrix} wmc(cofac(D1_{min},-v_0)) = \\ wmc\_ps([cofac(-D2,v_0) \wedge sub(-D1_{dc},v_0,v_1,...v_{k-1})],v_0,v_1,...v_{k-1}) \end{bmatrix} \end{pmatrix} AND \\ \begin{pmatrix} \begin{bmatrix} wmc(cofac(D1_{min},-v_0)) \leq wmc\_ps(cofac(-D2,v_0),v_0,v_1,...v_{k-1}) \\ \leq wmc(cofac(D1_{max},-v_0)) \end{bmatrix} AND \\ \begin{bmatrix} wmc(cofac(D1_{min},v_0)) \leq wmc\_ps(cofac(-D2,-v_0),v_0,v_1,...v_{k-1}) \\ \leq wmc(cofac(D1_{max},v_0)) \end{bmatrix} \end{pmatrix} \end{bmatrix} AND$$

$$\begin{bmatrix} \begin{pmatrix} \begin{bmatrix} wmc(cofac(D1_{min},v_1)) = \\ wmc\_ps([cofac(-D2,-v_1) \wedge sub(-D1_{dc},v_0,v_1,...v_{k-1})],v_0,v_1,...v_{k-1}) \end{bmatrix} AND \\ \begin{bmatrix} wmc(cofac(D1_{min},-v_1)) = \\ wmc\_ps([cofac(-D2,v_1) \wedge sub(-D1_{dc},v_0,v_1,...v_{k-1})],v_0,v_1,...v_{k-1}) \end{bmatrix} \end{pmatrix} AND \\ \begin{pmatrix} \begin{bmatrix} wmc(cofac(D1_{min},-v_1)) \leq wmc\_ps(cofac(-D2,v_1),v_0,v_1,...v_{k-1}) \\ \leq wmc(cofac(D1_{max},-v_1)) \end{bmatrix} AND \\ \begin{bmatrix} wmc(cofac(D1_{min},v_1)) \leq wmc\_ps(cofac(-D2,-v_1),v_0,v_1,...v_{k-1}) \\ \leq wmc(cofac(D1_{max},v_1)) \end{bmatrix} \end{pmatrix} \end{bmatrix} AND$$

$$\ldots$$

$$\begin{bmatrix} \begin{pmatrix} \begin{bmatrix} wmc(cofac(D1_{min},v_{k-1})) = \\ wmc\_ps([cofac(-D2,-v_{k-1}) \wedge sub(-D1_{dc},v_0,v_1,...v_{k-1})],v_0,v_1,...v_{k-1}) \end{bmatrix} AND \\ \begin{bmatrix} wmc(cofac(D1_{min},-v_{k-1})) = \\ wmc\_ps([cofac(-D2,v_{k-1}) \wedge sub(-D1_{dc},v_0,v_1,...v_{k-1})],v_0,v_1,...v_{k-1}) \end{bmatrix} \end{pmatrix} AND \\ \begin{pmatrix} \begin{bmatrix} wmc(cofac(D1_{min},-v_{k-1})) \leq wmc\_ps(cofac(-D2,v_{k-1}),v_0,v_1,...v_{k-1}) \\ \leq wmc(cofac(D1_{max},-v_{k-1})) \end{bmatrix} AND \\ \begin{bmatrix} wmc(cofac(D1_{min},v_{k-1})) \leq wmc\_ps(cofac(-D2,-v_{k-1}),v_0,v_1,...v_{k-1}) \\ \leq wmc(cofac(D1_{max},v_{k-1})) \end{bmatrix} \end{pmatrix} \end{bmatrix}$$

Figure 11A

```
1   /* "F" represents a sub-design and "C" represents a care set. The conjunction of F and C is found,
2   where F and C are BDDs. "L" is the depth of the BDD variable currently being processed. The
3   top-level call to ComputeWithCareSet sets "L" to zero. */
4   ComputeWithCareSet (F, C, L)
5   {
6
7   if (F == 0 || C == 0)
8       return (0);
9   if (F == 1)
10      return (wmc(C));
11  if (C == 1)
12      return (wmc(F));
13
14  T = ComputeWithCareSet( cofac(F, v_L), cofac(C, v_L), L+1 )
15
16  if ( cofac(F,-v_L) is negated)
17      E = wmc( cofac(C, -v_L) ) –
18          ComputeWithCareSet( not( cofac(F, -v_L) ), cofac(C, -v_L) , L+1 );
19  Else
20      E = ComputeWithCareSet( cofac(F, -v_L), cofac(C, -v_L) , L+1 );
21
22  return ( $\frac{(T \cdot v2wt(v_L) + E)}{2}$ )
23
24  }
```

Figure 11B

```
1   /* This procedure is intended for application to BDDs where redundant nodes have been removed.
2      Otherwise this procedure is the same as that of Figure 11A. */
3   ComputeWithCareSet (F, C)
4   {
5
6   if (F == 0 || C == 0)
7           return (0);
8   if (F == 1)
9           return (wmc(C));
10  if (C == 1)
11          return (wmc(F));
12  L = min( bdd_level(F), bdd_level(C) );
13  T = ComputeWithCareSet( cofac(F, vL), cofac(C, vL) );
14
15  if ( cofac(F,-vL) is negated)
16          E = wmc( cofac(C, -vL) ) –
17                  ComputeWithCareSet( not( cofac(F, -vL) ), cofac(C, -vL) );
18  Else
19          E = ComputeWithCareSet( cofac(F, -vL), cofac(C, -vL) );
20
21  return ( $\frac{(T \cdot v2wt(v_L) + E)}{2}$ );
22
23  }
24
```

Figure 13

```
1   distinguish_designs ( $\frac{D1_0(i_0,i_1,...i_{n-1}), D1_1(i_0,i_1,...i_{n-1}), ... D1_{m-1}(i_0,i_1,...i_{n-1}),}{D2_0(i_0,i_1,...i_{n-1}), D2_1(i_0,i_1,...i_{n-1}), ... D2_{m-1}(i_0,i_1,...i_{n-1})}$ )
2   {
3       /* Initially, put all sub-designs, of the first and second compare designs, into one equivalence class
4       and call it EC_one */
5       $EC_{one} = \begin{Bmatrix} D1_0(i_0,i_1,...i_{n-1}), D1_1(i_0,i_1,...i_{n-1}),...D1_{m-1}(i_0,i_1,...i_{n-1}), \\ D2_0(i_0,i_1,...i_{n-1}), D2_1(i_0,i_1,...i_{n-1}),...D2_{m-1}(i_0,i_1,...i_{n-1}) \end{Bmatrix}$ ;
6       /* Put EC_one into set, EC_all, of all equivalence classes found thus far. */
7       $EC_{all} = \left\{ \begin{Bmatrix} D1_0(i_0,i_1,...i_{n-1}), D1_1(i_0,i_1,...i_{n-1}),...D1_{m-1}(i_0,i_1,...i_{n-1}), \\ D2_0(i_0,i_1,...i_{n-1}), D2_1(i_0,i_1,...i_{n-1}),...D2_{m-1}(i_0,i_1,...i_{n-1}) \end{Bmatrix} \right\}$ ;
8       /* Find all equivalence classes that can be identified with just OMC. Only exceptions, to putting
9       two sub-designs in separate equivalence classes where their OMCs are different, are output
10      inversion and don't cares. This is because input inversion doesn't change OMC so it doesn't need
11      to be detected. It is not necessary to use OMC (e.g., by calling BreakEqClassWithOmc) before
12      WMC (e.g., by calling BreakEqClassWithWmc), but it is more efficient to use OMC first. */
13      EC_all = BreakEqClassWithOmc(EC_one, EC_all)
14
15      /* For the equivalence classes found with OMC, see which can be further broken up with WMC.
16      Results are accumulated in EC_all. */
17      For each EC_cur in EC_all
18      {
19              /* Result of WMC is to replace EC_cur, in EC_all, with any sub-equivalence classes that EC_cur
20              was divided into. */
21              EC_all = BreakEqClassWithWmc(EC_cur, EC_all);
22      }
23
24      return (EC_all);
25  }
```

Figure 14

```
1    /* BreakEqClassWithOmc called with following values for its parameters:
```

$$2 \quad EC_{one} = \begin{cases} D1_0(i_0,i_1,...i_{n-1}), D1_1(i_0,i_1,...i_{n-1}),...D1_{m-1}(i_0,i_1,...i_{n-1}), \\ D2_0(i_0,i_1,...i_{n-1}), D2_1(i_0,i_1,...i_{n-1}),...D2_{m-1}(i_0,i_1,...i_{n-1}) \end{cases};$$

$$3 \quad EC_{all} = \left\{ \begin{cases} D1_0(i_0,i_1,...i_{n-1}), D1_1(i_0,i_1,...i_{n-1}),...D1_{m-1}(i_0,i_1,...i_{n-1}), \\ D2_0(i_0,i_1,...i_{n-1}), D2_1(i_0,i_1,...i_{n-1}),...D2_{m-1}(i_0,i_1,...i_{n-1}) \end{cases} \right\}; \ */$$

```
4    BreakEqClassWithOmc(ECone, ECall)
5    {
6      if (number of sub-designs in ECone ≤ 2 ) return ECall;
7      /* Prepare for OMC by converting each sub-design of ECone into a BDD. To produce the BDDs,
8       need to select which variables of ECone are to remain symbolic. The n inputs to ECone are its
9       primary inputs and, to represent the state bits, there is one for each equivalence class that is a
10      member of ECall. */
11     Vs = ChooseSymbolicVariables (ECone, ECall);
12
13     /* Build BDD for each sub-design of ECone, based upon the subset of variables selected to remain
14      symbolic. This can be accomplished by a depth-first search of each sub-design, where each
15      sub-design is represented as a tree structure of gates. During the BDD construction, variables not
16      selected to remain symbolic can have particular binary values assigned. */
17     BDD = BuildBddInEqClass(ECone, Vs);
18
19     /* Using the BDDs produced, see whether ECone can be divided into multiple equivalence classes.
20     */
21     NewEC = FindMatchWithOmc(ECone, BDD);
22
23     /* If NewEC contains only one equivalence class, then no further subdivision of ECone is possible
24      with OMC, so just return ECall. */
25     if (number of members of NewEC = 1) return (ECall);
26
27     /* Remove ECone as an element of ECall. Add the members of NewEC to ECall. */
28     ECall = (EC_{all} - EC_{one}) ∪ NewEC ;
29
30     /* For the equivalence classes found with OMC, see which can be further broken up with OMC by
31      recursively calling BreakEqClassWithOmc. In the recursive calls, ChooseSymbolicVariables has
32      more variables to choose from, when choosing those variables to remain symbolic, since there is
33      one symbolic variable for each equivalence class of ECall. Results are accumulated in ECall. */
34     For each ECcur in NewEC
35     {
36            ECall = BreakEqClassWithOmc(ECcur, ECall);
37     }
38
39     return (ECall);
40   }
```

Figure 15

```
1   FindMatchWithOmc(EC_one, BDD)
2   {
3       NewEC = { };
4
5       /* For don't cares, each $D_i$ is represented by two sub-designs, selected from among $D\_min_i$,
6       $D\_max_i$ and $D\_dc_i$. */
7       For each sub-design $D_i$ in EC_one
8       {
9           /* For don't cares, $omc\_D_i$ can be a range of $\geq 1$ values and $matches\_D_i$ can be $\geq 1$.
10          */
11          $omc\_D_i$ = find_OMC ($bdd\_D_i$);
12          /* Finding $matches\_D_i$ can be done by a fast hash-table look-up using a key based on
13          $omc\_D_i$ */
14          $matches\_D_i$ = set of ECs, in NewEC, that match $omc\_D_i$;
15
16          if (size of $matches\_D_i$ = 0)
17              /* Start a new equivalence class {$D_i$} that just contains $D_i$. Add the new
18              equivalence class to NewEC. Therefore, if NewEC were the empty set, before the
19              below statement is performed, after the below is executed NewEC = { {$D_i$} }. */
20              NewEC = NewEC ∪ { {$D_i$} };
21          Else
22          /* size of $matches\_D_i \geq 1$. If size of $matches\_D_i > 1$, then don't cares are being
23          represented. */
24          {
25              /* Need to create a new EC for NewEC, called NewElement, that is the union of
26              the elements of $matches\_D_i$ with $D_i$. Start the formation of NewElement as a
27              set that just contains $D_i$. */
28              NewElement = { $D_i$ };
29              for each matches_EC ∈ $matches\_D_i$
30              {
31                  /* Remove each EC, that matches the OMC of $D_i$, from NewEC. */
32                  NewEC = NewEC - matches_EC;
33                  /* Create a new EC for NewEC that is the union of the elements of
34                  $matches\_D_i$ with $D_i$. */
35                  NewElement = NewElement ∪ matches_EC;
36              }
37              NewEC = NewEC ∪ NewElement;
38          }
39      } /* end "for" loop */
40      return (NewEC);
41  } /* End FindMatchWithOmc */
```

Figure 16

```
1   /* Differences, between BreakEqClassWithOmc and BreakEqClassWithWmc, include
2   BreakEqClassWithWmc calling ChooseUniqueWeights and then passing those weights as a
3   parameter when determining NewEC. */
4   BreakEqClassWithWmc(ECone, ECall)
5   {
6   if (number of sub-designs in ECone ≤ 2 ) return ECall;
7   /* Prepare for WMC by converting each sub-design of ECone into a BDD. To produce the BDDs,
8   need to select which variables of ECone are to remain symbolic. The n inputs to ECone are its
9   primary inputs and, to represent the state bits, there is one for each equivalence class that is a
10  member of ECall. */
11  Vs = ChooseSymbolicVariables (ECone, ECall);
12
13  /* Choose a unque weight for each symbolic variable. */
14  Us = ChooseUniqueWeights (Vs);
15
16  /* Build BDD for each sub-design of ECone, based upon the subset of variables selected to remain
17  symbolic. This can be accomplished by a depth-first search of each sub-design, where each
18  sub-design is represented as a tree structure of gates. During the BDD construction, variables not
19  selected to remain symbolic can have particular binary values assigned. */
20  BDD = BuildBddInEqClass(ECone, Vs);
21
22  /* Using the BDDs produced, see whether ECone can be divided into multiple equivalence classes.
23  */
24  NewEC = FindMatchWithWmc(ECone, BDD, Us);
25
26  /* If NewEC contains only one equivalence class, then no further subdivision of ECone is possible
27  with WMC, so just return ECall. */
28  if (number of members of NewEC = 1) return (ECall);
29
30  /* Remove ECone as an element of ECall. Add the members of NewEC to ECall. */
31  ECall = $(EC_{all} - EC_{one}) \cup NewEC$ ;
32
33  /* For the equivalence classes found with WMC, see which can be further broken up with WMC by
34  recursively calling BreakEqClassWithWmc. In the recursive calls, ChooseSymbolicVariables has
35  more variables to choose from, when choosing those variables to remain symbolic, since there is
36  one symbolic variable for each equivalence class of ECall. Results are accumulated in ECall. */
37  For each ECcur in NewEC
38  {
39          ECall = BreakEqClassWithWmc(ECcur, ECall);
40  }
41
42  return (ECall);
43  }
```

Figure 17

```
1    FindMatchWithWmc(EC_one, BDD, U_s)
2    {
3    NewEC = { };
4    For each sub-design D_i in EC_one
5    {
6            Matched = FALSE;
7            For each EC_cur in NewEC
8            {
9                    /* R can be any sub-design of EC_cur */
10                   R = a representative sub-design of EC_cur;
11
12                   /* CheckRelationsWithOmc returns FALSE if, with OMC, the BDD of D_i and the
13                   BDD of R can be determined to represent different functions. */
14                   if (CheckRelationsWithOmc( BDD(R), BDD( D_i ) ) == FALSE)
15                           /* Try next EC of NewEC since D_i cannot be part of EC_cur */
16                           continue;
17                   /* Any pairs of inputs, between the BDD of D_i and the BDD of R, that are
18                   consistent with being input inversions of each other, are identified. */
19                   Inv = FindInputInversions(R, D_i , BDD(R), BDD( D_i ) );
20                   /* CheckRelationsWithWmc returns FALSE if, with WMC, the BDD of D_i and the
21                   BDD of R can be determined to represent different functions. */
22                   if (CheckRelationsWithWmc( BDD(R), BDD( D_i ), Inv, U_s ) == FALSE)
23                           /* Try next EC of NewEC since D_i cannot be part of EC_cur */
24                           continue;
25                   else
26                   {
27                           /* Since D_i and R cannot be distinguised, put them into the same EC */
28                           EC_cur = EC_cur ∪ D_i ;
29                           Matched = TRUE;
30                           /* Break from consideration of any further ECs of NewEC since the EC, to
31                           which D_i belongs, has been found. */
32                           break;
33                   }
34           } /* end "for" loop */
35
36           /* Initially, when NewEC is empty, "fall through" to here where D_i forms the basis of an
37           EC that becomes the first member of NewEC. */
38           if ( Matched == FALSE)
39                   NewEC = NewEC ∪ { {D_i} };
40   } /* end "for" loop */
41   return (NewEC);
42   } /* End FindMatchWithwmc */
```

Figure 18

```
1   FindInputInversions (SD1, SD2, BDD_SD1, BDD_SD2)
2   {
3       /* TestedVars contains all variables that have been tested for input inversion. */
4       TestedVars = { };
5       /* Tests all currently symbolic variables, using a known technique, for whether they are inverted
6       between SD1 and SD2. */
7       Inv = TestInputInversions (BDD_SD1, BDD_SD2)
8       /* Update TestedVars to contain all variables that have been tested for input inversion. Such
9       tested variables are represented by the support of BDD_SD1 or BDD_SD2. */
10      TestedVars = TestedVars ∪ Support(BDD_SD1);
11
12      /* Thus far, only those variables that had remained symbolic have been tested for input inversion.
13      The below "while" loop tests all those variables that had been assigned binary values. */
14      While (there exists any variable not in TestedVars)
15      {
16              var_cur = pick a variable not yet tested;
17              /* ChooseDirectedSymbolicVariables chooses the variables to remain symbolic, and sets
18              the binary values for the remaining variables, as part of an inter-dependent process.
19              Variables and binary values are chosen such that var_cur is observable at the outputs of
20              BDD_SD1 or BDD_SD2. The observability is needed such that var_cur can be tested for input
21              inversion. */
22              V_ii_s = ChooseDirectedSymbolicVariables (var_cur, SD1, SD2);
23              BDD_SD1 = BuildBdd (SD1, NULL, V_ii_s);
24              BDD_SD2 = BuildBdd (SD2, NULL, V_ii_s);
25              NewInv = TestInputInversions (BDD_SD1, BDD_SD2);
26              TestedVars = TestedVars ∪ Supports(BDD_SD1);
27              Inv = Inv ∪ NewInv;
28      } /* end "while" loop */
29
30      return (Inv);
31  } /* End FindInputInversions */
```

Figure 19A

```
1    /* Given an equivalence class "EC," that comprises a set of designs, and a set Vs of variables that
2    are to remain symbolic, constructs a BDD for each design. */
3    BuildBddInEqClass (EC, Vs)
4    {
5
6    /* iterate over each design "F" in the equivalence class EC. Build a separate BDD for each design
7    by calling "BuildBdd." */
8    for each F in EC
9    {
10           BDDi = BuildBdd (F, NULL, Vs);
11   }
12
13   /* return an array of BDDs by variable "BDD," one BDD for each design "F" of EC */
14   return (BDD);
15   }
16
17   /* P is parent of F  This procedure does a recursive, depth-first, traversal of the design "F" passed
18   to it. */
19   BuildBdd (F, P, Vs)
20   {
21
22   if (BDD is already built on F)
23           return (the BDD on F);
24
25   /* At this point, all we know if that F is either an input, an AND or an OR. Need to test for which. */
26
27   /* Handle case where F is an input */
28   if (F is an input)
29   {
30           if (the input is in Vs)
31                   BDD = BDD node representing the variable of Vs represented by F;
32           Else
33           {
34                   if (a binary value on F is already determined)
35                           BDD = the_already_determined_value;
36                   Else
37                           /* Assign a binary value to the input based upon the gate just traversed.
38                           Assuming all gates are either AND or OR. */
39                           if (P is AND) /* Assign non-controlling "1" for an AND */
40                                   BDD = BDD_ONE;
41                           Else /* Assign non-controlling "0" for an OR */
42                                   BDD = BDD_ZERO;
43           }
44           return (BDD);
45   }
46   /* Handle case where F is either an AND or an OR. Begin a BDD representation for F by starting it
47   as a "1" for an AND gate or a "0" for an OR. In the following loop, a BDDi is built for each input to
```

Figure 19B

```
1   F. Depending upon whether F is AND or OR, each BDD_i is ANDed or ORed together to create the
2   representation for F. */
3   if (F is AND)
4         BDD = BDD_ONE;
5   Else
6         BDD = BDD_ZERO;
7
8
9   For each gate G in the direct fanin of F
10  {
11        BDD_i = BuildBdd (G, F, V_s);
12
13        If (F is AND)
14              BDD = BDD ∧ BDD_i;
15        Else
16              BDD = BDD ∨ BDD_i;
17  }
18
19  if (F has an output inversion)
20        BDD = negated BDD;
21
22  Return (BDD);
23
24  }
```

METHOD AND APPARATUS FOR DISTINGUISHING COMBINATIONAL DESIGNS

FIELD OF THE INVENTION

The present invention relates generally to the comparison of combinational designs with the purpose of determining whether they are functionally different.

BACKGROUND OF THE INVENTION

Techniques for determining whether two combinational designs are functionally different (which can be referred to as "combinational design discriminators" or CDDs) have a wide range of applications.

An example application of CDDs, within the area of ASIC design, is for EDA software that needs to determine whether two sequential designs are equivalent (which can be referred to as the "sequential equivalence problem"). In the sequential equivalence problem, the two designs to be compared can be referred to as the "reference" and "implementation" designs. More generally, the two designs to be compared can be referred to as a first compare design and a second compare design. An overview of known ASIC design flow is presented below. Next a known approach to solving the sequential equivalence problem is presented.

An Overview of Known ASIC Design Flow

Before proceeding further with the description, it may be helpful to place this process in context. FIG. 21 shows a simplified representation of an exemplary digital ASIC design flow. At a high level, the process starts with the product idea (step 2100) and is realized in an EDA software design process (step 2110). When the design is finalized, it can be taped-out (event 2140). After tape out, the fabrication process (step 2150) and packaging and assembly processes (step 2160) occur resulting, ultimately, in finished chips (result 2170).

The EDA software design process (step 2110) is actually composed of a number of steps 2112-2130, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components steps of the EDA software design process (step 2110) will now be provided. The sequential equivalence problem can occur in step 2118 ("Netlist verification"), since this is when a designer can have a reference design (resulting from step 2114 "Logic design and functional verification") and an implementation design (resulting from step 2116 "Synthesis and design for test"):

a) System design (step 2112): The designers describe the functionality that they want to implement; they can perform what-if planning to refine functionality, check costs, etc. Hardware-software architecture partitioning can occur at this stage. Exemplary EDA software products from Synopsys, Inc. that can be used at this step include Model Architect, Saber, System Studio, and DesignWare® products.

b) Logic design and functional verification (step 2114): At this stage, the VHDL or Verilog code for modules in the system is written and the design is checked for functional accuracy. More specifically, the design is checked to ensure production of functionally correct outputs. Exemplary EDA software products from Synopsys, Inc. that can be used at this step include VCS, VERA, DesignWare®, Magellan, Formality, ESP and LEDA products.

c) Synthesis and design for test (step 2116): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Physical Compiler, Test Compiler, Power Compiler, FPGA Compiler, Tetramax, and DesignWare® products.

d) Netlist verification (step 2118): At this step, the netlist is checked for compliance with timing constraints and for correspondence with the VHDL/Verilog source code. Exemplary EDA software products from Synopsys, Inc. that can be used at this step include Formality, PrimeTime, and VCS products.

e) Design planning (step 2120): Here, an overall floorplan for the chip is constructed and analyzed for timing and top-level routing. Exemplary EDA software products from Synopsys, Inc. that can be used at this step include Astro and IC Compiler products.

f) Physical implementation (step 2122): The placement (positioning of circuit elements) and routing (connection of the same) occurs at this step. Exemplary EDA software products from Synopsys, Inc. that can be used at this step include the Astro and IC Compiler products.

g) Analysis and extraction (step 2124): At this step, the circuit function is verified at a transistor level, this in turn permits what-if refinement. Exemplary EDA software products from Synopsys, Inc. that can be used at this step include AstroRail, PrimeRail, Primetime, and Star RC/XT products.

h) Physical verification (step 2126): At this step various checking functions are performed to ensure correctness for: manufacturing, electrical issues, lithographic issues, and circuitry. Exemplary EDA software products from Synopsys, Inc. that can be used at this step include the Hercules product.

i) Resolution enhancement (step 2128): This step involves geometric manipulations of the layout to improve manufacturability of the design. Exemplary EDA software products from Synopsys, Inc. that can be used at this step include Proteus, ProteusAF, and PSMGen products.

j) Mask data preparation (step 2130): This step provides the "tape-out" data for production of masks for lithographic use to produce finished chips. Exemplary EDA software products from Synopsys, Inc. that can be used at this step include the CATS(R) family of products.

An Example Approach to Solving the Sequential Equivalence Problem

For each of the first and second compare designs, a set of representative combinational sub-designs can be determined. The set of representative combinational sub-designs for the first compare design can be referred to as the "first combinational sub-designs" and the set of representative combinational designs for the second compare design can be referred to as the "second combinational sub-designs."

As an example, a combinational sub-design can represent the next-state function for one bit of state, in either the first or second compare design.

A goal, in the solution of the sequential equivalence problem, can be for each member of the first combinational sub-designs to be paired with a corresponding member of the second combinational sub-designs. Each such pair of designs can be referred to as a "combinational design pair." A process, by which combinational design pairs can be identified, with a CDD, can include the following steps. A subset of the first combinational sub-designs and a subset of the second combinational sub-designs can be combined to create an equivalence class (or "EC"). This EC, that can be referred to as "EC_for_CDD," can be divided into smaller ECs by determining, with a CDD, that pairs of combinational designs, within EC_for_CDD, are functionally distinct. A goal of such subdivision can be to convert EC_for_CDD into a set of smaller ECs, where each of the smaller ECs is a combinational design pair.

Once all combinational design pairs have been identified, the potential equivalence, between the members of each such pair, can be addressed. If the members of a combinational design pair are equivalent, the pair can be referred to as an "equivalent combinational design pair."

If all combinational design pairs are equivalent combinational design pairs, the first compare design and the second compare design are equivalent.

It is important to note that even if a particular CDD has placed two combinational designs in the same combinational design pair, it does not mean the combinational design pair, if processed for equivalence determination, will be found to represent equivalent functions. Unless one has gone to the computational effort of determining, positively, whether the members of a combinational design pair are in-fact equivalent, it can be the case that a better CDD can rule-out the same combinational design pair as a candidate for application to an equivalence determination process.

Therefore, while there are known methods of combinational design discrimination, there is a need for better methods of discriminating between combinational designs such that a more computationally expensive step (e.g., that of positive equivalence determination) can be avoided as often as possible.

SUMMARY OF THE INVENTION

Please refer to the Glossary of Selected Terms, included at the end of the Detailed Description, for the definition of selected terms used in the below Summary. Section numbers in the below Summary correspond to section numbers in the Detailed Description.

1. Summary of Application of Minterm Counting

Processes are described for application of minterm counting, both ordinary minterm counting (OMC) and weighted minterm counting (WMC), as combinational design discriminators (CDDs). The processes operate by applying minterm counting to a pair of combinational sub-designs D1 and D2. Each such sub-design can be regarded as comprised of n input variables and one output variable.

Regardless of whether the minterm counting is OMC or WMC, when don't cares are not utilized, a general process for application of minterm counting is as follows.

D1 and D2 can each be converted into a data representation (e.g., the BDD data representation) suitable for application of minterm counting. Suitable data representations for D1 and D2 can be referred to as, respectively, $D1_{DREP}$ and $D2_{DREP}$. Regardless of the type of data structure used, it can be viewed as being representative of a set of minterms, where the set of minterms defines a functionality of the sub-design.

Prior to conversion of D1 and D2 into $D1_{DREP}$ and $D2_{DREP}$ the input variables of D1 and D2 can be reduced by assigning binary values to some of them.

$D1_{DREP}$ and $D2_{DREP}$ can each be assigned a minterm count, respectively $MC\_D1_{DREP}$ and $MC\_D2_{DREP}$, that is equivalent to assigning an appropriate weighting to the set of minterms each such data structure represents.

If $MC\_D1_{DREP}$ and $MC\_D2_{DREP}$ are within a certain tolerance of each other, then D1 and D2 cannot be distinguished by the particular type of minterm counting applied.

If $MC\_D1_{DREP}$ and $MC\_D2_{DREP}$ are not within a certain tolerance of each other, then it is known that D1 and D2 represent different functionalities.

Even if D1 and D2, in a strict sense, represent different functionalities, their functionalities may still be sufficiently related such that classification of D1 and D2 as differing functionalities is inappropriate. Each such test of relatedness, between a pair of sub-designs D1, and D2, is referred to herein as an "exception."

A general process for application of minterm counting, when don't cares are part of a design specification, is as follows.

A D1 can have an input combination for which the designer has specified a "don't care" as to what output is produced. Such an input combination can match any corresponding value produced by D2. A D1 can contain one or more "don't care" combinations.

In order to express one or more "don't care" combinations, a design D1 can be expressed by any two of the following types of design specifications: $D1_{dc}$, $D1_{min}$ and $D1_{max}$. $D1_{dc}$ is defined to produce a true value for each set of input combinations, $inputs_x$, for which a designer has specified a "don't care." For each set of input combinations to D1, $D1_{min}$ and $D1_{max}$ are defined to produce the same value, except for any set of inputs $inputs_x$ for which $D1_{dc}$ produces a true value. For each $inputs_x$ where $D1_{dc}$ produces a true value, $D1_{min}$ is defined to produce a zero and $D1_{max}$ is defined to produce a one.

Suitable minterm counting data representations of $D1_{dc}$, $D1_{min}$ and $D1_{max}$, referred to respectively as $D1_{dc,DREP}$, $D1_{min,DREP}$ and $D1_{max,DREP}$, are determined. $D1_{dc,DREP}$, $D1_{min,DREP}$ and $D1_{max,DREP}$ can be determined provided the user has input at least two of $D1_{dc}$, $D1_{min}$ and $D1_{max}$. An example suitable data representation, for minterm counting, is a BDD. Regardless of the type of data structure used, it can be viewed as being representative of a set of minterms that can determine a functionality of $D1_{dc}$, $D1_{min}$ or $D1_{max}$.

A suitable minterm counting data representation for D2, referred to as $D2_{DREP}$, can be determined.

Prior to the production of $D1_{dc,DREP}$, $D1_{min,DREP}$, $D1_{max,DREP}$ and $D2_{DREP}$, the support of the sub-designs from each is determined. Each of these supports can be reduced by assigning binary values to some of the variables that would be included in the support.

$D1_{min,DREP}$, $D1_{max,DREP}$ and $D2_{DREP}$ can each be assigned a minterm count, respectively $MC\_D1_{min,DREP}$, $MC\_D1_{max,DREP}$ and $MC\_D2_{DREP}$. Determining a minterm count, for a data representation suitable for minterm counting, is equivalent to assigning an appropriate weighting to the set of minterms each such data structure represents.

A minterm count $MC\_D2_{min,DREP}$ can also be determined from $D1_{dc,DREP}$ and $D2_{DREP}$.

If the following relations are satisfied, then D1 and D2 cannot be distinguished by the particular type of minterm counting applied:

$$\text{if} \begin{pmatrix} [\text{mc}(D1_{min}) = \text{mc}(D2 \wedge -D1_{dc})] \\ \text{AND} \\ [\text{mc}(D1_{min}) \leq \text{mc}(D2) \leq \text{mc}(D1_{max})] \end{pmatrix}$$

then keep D1 and D2 in same EC

The above relation depicts two expressions, one on either side of an AND operator. If the expressions before and after the AND are determined to be true, then the relationship between D2 and D1 is consistent with D2 being within the range of functions encompassed by D1.

Even if D1 and D2, in a strict sense, represent different functionalities, it may still be the case that their functionalities are sufficiently related such that classification of D1 and D2 as differing functionalities is inappropriate. Each such test of relatedness, between a D1 and D2, is referred to herein as an "exception."

2. Summary of Ordinary Minterm Counting (OMC)

A known form of minterm counting is referred to herein as "ordinary" minterm counting or OMC. Application of OMC, to a suitable data representation of a sub-design, is as follows. OMC determines an integer that represents the sub-design. Regardless of how the integer is determined, it can be viewed as being equivalent to assigning a value of one to each minterm of the sub-design and computing the sum of all such assigned values.

3. Summary of Weighted Minterm Counting (WMC)

Rather than assigning the same weight (e.g., a weight of one) to each minterm, weighted minterm counting (WMC) assigns a weight that can vary. Such weight can vary, for example, by being a function of the particular literals of which a minterm is comprised.

For example, a weight can be assigned to each variable, comprising a minterm, that is a function of the particular variable and whether the variable is required to be in true or complemented form. The function, that assigns a weight to each variable of a minterm, can be referred to as a variable-level weighting function (VLWF). Example VLWFs are presented.

The weights assigned to each variable of a minterm can be combined, according to an appropriate function (referred to as a minterm-level weighting function or MLWF), to arrive at a total weight for each minterm. An example MLWF is finding the product of the weights assigned to each variable of a minterm.

The minterm weights for a particular combinational sub-design can be combined, according to an appropriate function (referred to as a design-level weighting function or DLWF), to arrive at a total weight for the sub-design. An example DLWF is to take the sum of the weights assigned to each minterm.

Where a sub-design is expressed as a BDD, and where the VLWF, MLWF and DLWF to be applied are known, a suitable set of expressions, for the efficient determination of the BDD's WMC, can be determined.

A set of expressions is presented for the case where the DLWF is summation, the MLWF is multiplication and the VLWF satisfies certain constraints.

4. Summary of Exceptions to OMC, Without Don't Cares

Even if OMC indicates D1 and D2 are different, there can be exceptions to classifying the designs into different equivalence classes. The two basic types of exceptions are: output inversion and input inversion. These two basic types of exceptions can be combined to produce a total of three exception types. Each of these exception types is addressed below.

The output inversion exception can be expressed as follows: D1 is consistent with being the same as D2, except that the output of D2 is inverted with respect to the output of D1. Example expressions, for testing for the output inversion exception, are presented.

Using known techniques, one can determine the following: whether, as a necessary-but-insufficient condition for equivalency between D1 and D2, a pair of corresponding inputs, one input applied to D1 and the other input applied to D2, must be inverted with respect to each other.

Each pair of inputs identified as needing to be inverted, as a necessary-but-insufficient condition, can then be further tested to determine whether the pair is consistent with being inverted when tested according to OMC.

If all such pairs are consistent with being inverted according to OMC, then D1 and D2 can be kept in the same equivalence class. In addition, the outputs of the two combinational sub-designs can be compared, using OMC, to determine whether they are consistent with being output inversions of each other.

Example expressions, for application of OMC-based exceptions, are presented.

5. Exceptions to WMC, Without Don't Cares

Even if WMC indicates that D1 and D2 are different, there can be exceptions to classifying the sub-designs into different equivalence classes. As with OMC, these exceptions can be of three types: output inversion, input inversion or a combination of output and input inversion. Each of these three exception types is addressed below.

The output inversion exception can be expressed as follows: D1 cannot be distinguished from the inverse functionality of D2 (i.e., −D2). Example expressions, for testing for the output inversion exception, are presented.

As discussed above, using known techniques one can determine which pairs of inputs between two sub-designs, as a necessary-but-insufficient condition for equivalency between the two sub-designs, must be inverted with respect to each other.

Each pair of inputs identified as needing to be inverted, as a necessary-but-insufficient condition, can then be further tested to determine whether the pair is consistent with being inverted when tested according to WMC. If all such pairs are consistent with being inverted according to WMC, then D1 and D2 can be kept in the same equivalence class. In addition, the outputs of the two combinational sub-designs can be compared, using WMC, to determine whether they are consistent with being output inversions of each other.

Example expressions, for application of WMC-based exceptions, are shown.

6. Summary of Exceptions to MC, with Don't Cares

When an MC is applied with D1 having a don't care specification, even if the MC indicates that D1 and D2 are different, there can be exceptions to classifying the sub-designs into different equivalence classes. The two basic types of exceptions are: output inversion and input inversion. The two basic types of exceptions can be combined to produce a total of three exception types. Each of these three exception types is addressed below.

OMC and WMC expressions to test for output inversion are essentially identical to the expression, presented above, for the general application MC with don't cares.

A set of k input variables can be determined, as a necessary-but-insufficient condition for equivalency between two sub-designs, as needing to be inverted with respect to each other.

Given the set of k input variables, an expression to test, with OMC, whether those variables are consistent with being input inverted, is presented. A further expression is presented that combines testing for input inversion with OMC with testing for output inversion with OMC.

Given the set of k input variables, an expression to test, with WMC, whether those variables are consistent with being input inverted, is presented. A further expression is presented that combines testing for input inversion with WMC with testing for output inversion with WMC.

7. Summary of Functions for Defining Exceptions

Functions, useful for compactly presenting exception expressions, are presented.

8. Summary of Partial BDD Production

A D1 and D2 may be too large for complete conversion into a BDD representation. However, since the goal of analyzing the BDDs, that represent D1 and D2, is to determine whether D1 and D2 are different, it is not necessary for the entirety of D1 and D2 to be converted into the BDD form. Heuristic approaches can be used to select the appropriate portions of D1 and D2, for conversion into BDDs, such that the ability to distinguish D1 and D2 will be preserved.

Without loss of generality, it will be assumed that D1 and D2 both accept n inputs. Some of those n inputs are m state bits. One of the sub-designs (for purposes of example D1 is selected) is used for guiding the partial BDD construction. A first compare design, from which D1 can be drawn, can be represented by m such sub-designs, each of which determines the value of a state bit. For those sub-designs in a same EC, their outputs, when present among the n inputs, can be treated as a single input.

Of the n inputs to D1, k inputs (where k≦n) can be selected to remain as symbolic variables, with the remaining n–k inputs assigned a literal binary value. Selection of the k inputs can be accomplished by any suitable method, including heuristically-guided methods. An example heuristically-guided method for symbolic variable selection is presented.

Selection of binary values for the remaining n–k inputs can be accomplished by any suitable method, including heuristically-guided methods. An example method is presented. An example pseudo-coded procedure, for performing binary value assignment, is presented.

9. Summary of Example Application of WMC

A pseudo-coded procedure, called "distinguish_designs," is presented that accepts a first and second compare designs, each of which is comprised of m sub-designs.

If distinguish_designs is successful in its application of WMC, each EC, of an $EC_{all}$ returned value, should contain two sub-designs that constitute a combinational design pair.

As discussed above, a potential application of distinguish_designs is the sequential equivalence problem. If all combinational design pairs are equivalent, it can be concluded that the first and second compare designs are equivalent.

Each sub-design passed to distinguish_designs accepts n input variables. Each sub-design represents the next-state function for one-bit of state storage. The first and second compare designs are each assumed to have m state bits.

BRIEF DESCRIPTION OF THE DRAWINGS

The accompanying drawings, that are incorporated in and constitute a part of this specification, illustrate several embodiments of the invention and, together with the description, serve to explain the principles of the invention:

FIG. 2A depicts an example function, in a form suitable for OMC, as a Karnaugh map.

FIG. 2B depicts the example function of FIG. 2A, in a form suitable for WMC, also as a Karnaugh map.

FIGS. 3A-3E depict a suitable set of expressions for the determination of a BDD's WMC.

FIGS. 4A-4E present example pseudo-code for implementing the expressions of FIGS. 3A-3E.

FIGS. 6A-6D present example expressions of exceptions when using OMC without don't cares.

FIGS. 7A-7D present example expressions of exceptions when using WMC without don't cares.

FIGS. 8A, 9A and 10A present example expressions of exceptions when using OMC with don't cares.

FIGS. 8B, 9B and 10B present example expressions of exceptions when using WMC with don't cares.

FIGS. 11A-11B present an example pseudo-coded procedure, "ComputeWithCareSet," for performing a conjunction in a more efficient way.

FIG. 13 presents a pseudo-code procedure "distinguish_designs."

FIG. 14 presents a pseudo-code procedure "BreakEqClassWithOmc."

FIG. 15 presents a pseudo-code procedure "FindMatchWithOmc."

FIG. 16 presents a pseudo-code procedure "BreakEqClassWithWmc."

FIG. 17 presents a pseudo-code procedure "FindMatchWithWmc."

FIG. 18 presents a pseudo-code procedure "FindInputInversions."

FIGS. 19A-19B present a pseudo-code procedure "BuildBddInEqClass."

DETAILED DESCRIPTION OF PREFERRED EMBODIMENTS

Reference will now be made in detail to preferred embodiments of the invention, examples of which are illustrated in the accompanying drawings. Wherever possible, the same reference numbers will be used throughout the drawings to refer to the same or like parts.

Please refer to the Glossary of Selected Terms, included at the end of the Detailed Description, for the definition of selected terms used below.

Table of Contents to Detailed Description

Figure 1A:
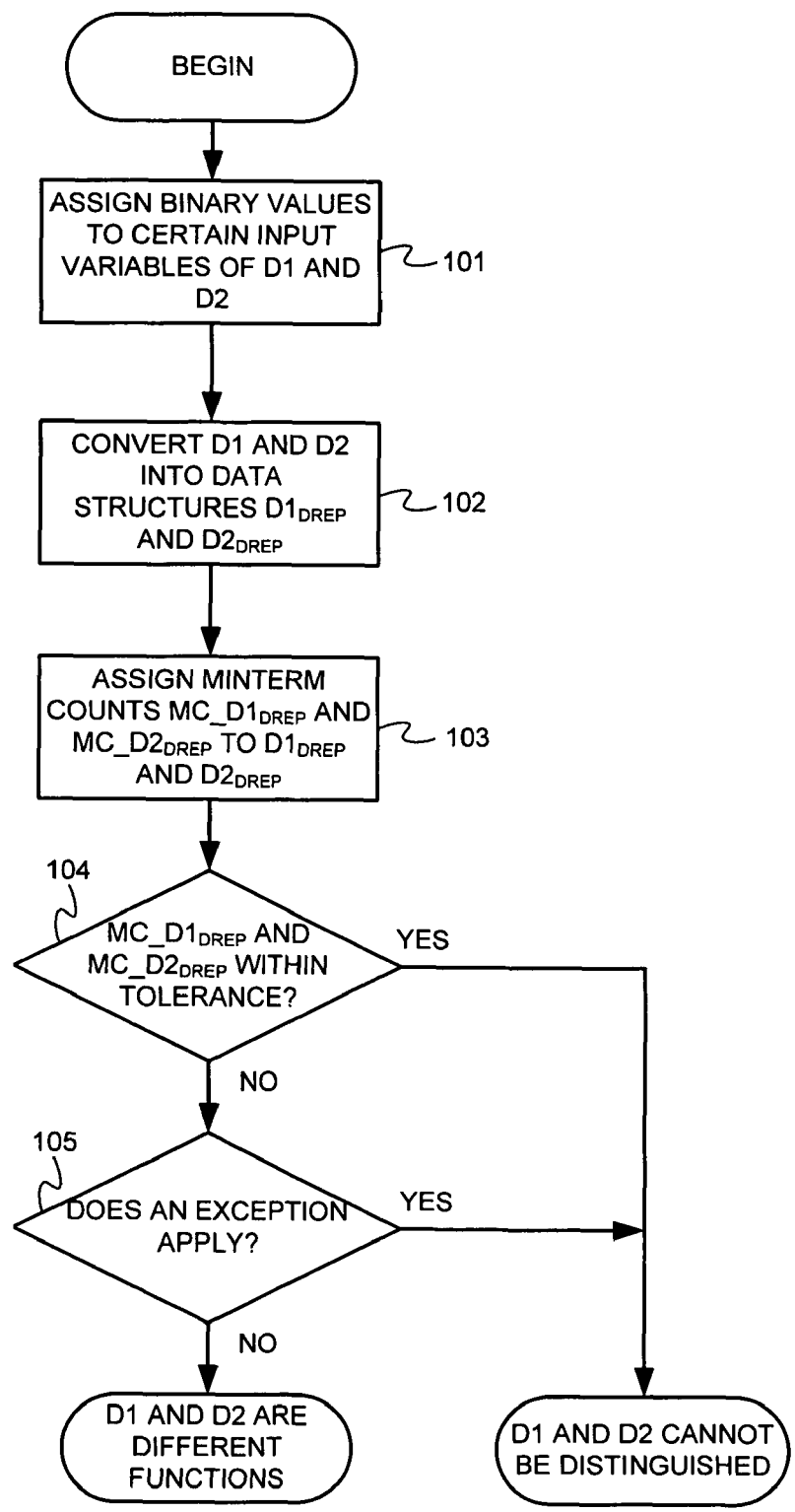
FIG. 1A depicts a general process for application of minterm counting.
Figure 1B:
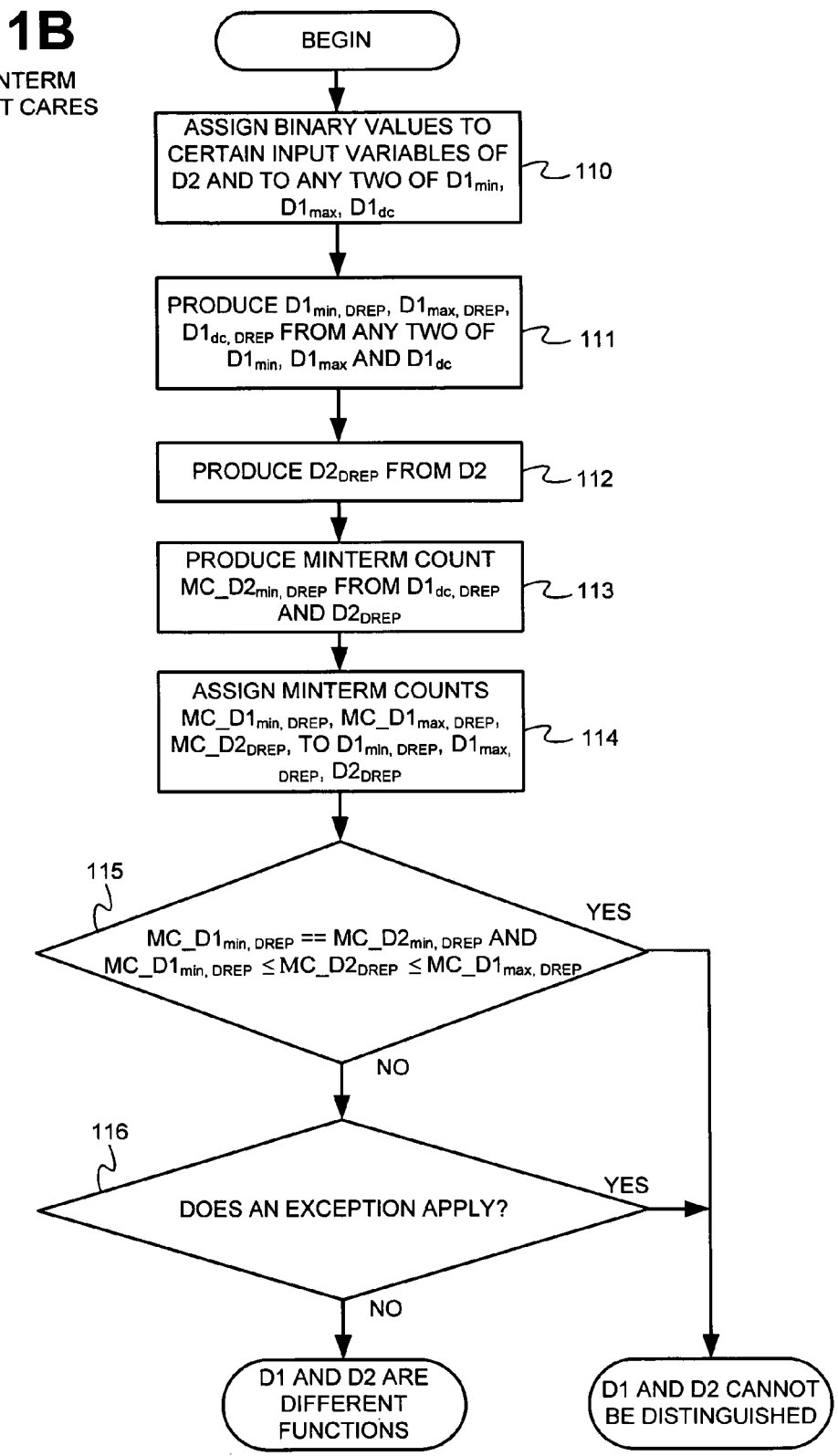
FIG. 1B depicts a general process for application of minterm counting when don't cares are part of a design specification.

1. Application of Minterm Counting
   1.1. Without Don't Cares
   1.2. With Don't Cares
      1.2.1. Conjoining BDDs
2. Ordinary Minterm Counting (OMC)
   2.1. For BDDs 3. Weighted Minterm Counting (WMC)
   3.1. Example VLWFs
   3.2. Example Sub-Design
   3.3. Application To BDDs
      3.3.1. Example Expressions
      3.3.2. Example Pseudo-Code
      3.3.3. Example BDDs
4. Exceptions to OMC, Without Don't Cares
   4.1. Output Inversion
   4.2. Input Inversion
   4.3. Output Inversion and Input Inversion
5. Exceptions to WMC, Without Don't Cares
   5.1. Output Inversion
   5.2. Input Inversion
   5.3. Output Inversion and Input Inversion
6. Exceptions to MC, With Don't Cares
   6.1. Output Inversion
   6.2. Input Inversion
   6.3. Output Inversion and Input Inversion
7. Functions for Defining Exceptions
8. Partial BDD Production
   8.1. Symbolic Variable Selection
      8.1.1. Example
   8.2. Binary Value Selection
      8.2.1. Example Pseudo-Code
9. Example Application of WMC
   9.1. Distinguish_Designs
   9.2. BreakEqClassWithOmc
   9.3. FindMatchWithOmc
   9.4. BuildBddInEqClass
   9.5. BreakEqClassWithWmc
   9.6. FindMatchWithWmc
   9.7. FindInputInversions
10. Hardware Environment
11. Glossary of Selected Terms 1. Application of Minterm Counting Below described are processes for application of minterm counting, both ordinary minterm counting (OMC) and weighted minterm counting (WMC), as combinational design discriminators (CDDs). Regardless of whether the minterm counting is OMC or WMC, a general process for application of minterm counting, when don't cares are not utilized, is depicted in FIG. 1A. FIG. 1B depicts a general process for application of minterm counting when don't cares are part of a design specification.

The processes of FIGS. 1A and 1B each operate by applying minterm counting to a pair of combinational sub-designs D1 and D2. Without loss of generality, each such sub-design can be regarded as comprised of n input variables and one output variable.

1.1. Without Don't Cares

Please refer to FIG. 1A in conjunction with this section.

D1 and D2 can each be converted into a data representation (e.g., the BDD data representation) suitable for application of minterm counting. Step 102. Suitable data representations for D1 and D2 can be referred to as, respectively, $D1_{DREP}$ and $D2_{DREP}$. Regardless of the type of data structure used, it can be viewed as being representative of a set of minterms, where the set of minterms defines a functionality of the sub-design.

Prior to conversion of D1 and D2 into $D1_{DREP}$ and $D2_{DREP}$, the input variables of D1 and D2 can be reduced by assigning binary values to some of them. Step 101. Such selective conversion of input variables to fixed binary values involves two main steps, that can be performed separately or in an interdependent fashion: selection of the variables to remain symbolic and selection of the binary value to assign to each non-symbolic variable.

$D1_{DREP}$ and $D2_{DREP}$ can each be assigned a minterm count, respectively $MC\_D1_{DREP}$ and $MC\_D2_{DREP}$, that is equivalent to assigning an appropriate weighting to the set of minterms each such data structure represents. Step 103.

If $MC\_D1_{DREP}$ and $MC\_D2_{DREP}$ are within a certain tolerance of each other, then D1 and D2 cannot be distinguished by the particular type of minterm counting applied (the "yes" branch of decision point 104 is followed).

If $MC\_D1_{DREP}$ and $MC\_D2_{DREP}$ are not within a certain tolerance of each other, then it is known that D1 and D2 represent different functionalities.

Even if D1 and D2, in a strict sense, represent different functionalities, their functionalities may still be sufficiently related such that classification of D1 and D2 as differing functionalities is inappropriate. Each such test of relatedness, between a pair of sub-designs D1 and D2, is referred to herein as an "exception" since it can be an exception to the classification of D1 and D2 as differing functionalities. The evaluation of exceptions is represented in FIG. 1A by step 105. Detailed discussion, of the types of exceptions that can be evaluated in step 105, are presented below in the following sections: 4 ("Exceptions to OMC, Without Don't Cares") and 5 ("Exceptions to WMC, Without Don't Cares").

1.2. With Don't Cares

Please refer to FIG. 1B in conjunction with this section.

A D1 can have an input combination for which the designer has specified a "don't care" as to what output is produced. Such an input combination can match any corresponding value produced by D2. A D1 can contain one or more "don't care" combinations. As an example of where a "don't care" specification can be useful, D1 can be a higher level design specification that can include don't cares, while D2 can be a more hardware-specific implementation.

In order to express one or more "don't care" combinations, a design D1 can be expressed by any two of the following types of design specifications: $D1_{dc}$, $D1_{min}$ and $D1_{max}$. $D1_{dc}$ is defined to produce a true value for each set of input combinations, $inputs_x$, for which a designer has specified a "don't care." For each set of input combinations to D1, $D1_{min}$ and $D1_{max}$ are defined to produce the same value, except for any set of inputs $inputs_x$ for which $D1_{dc}$ produces a true value. For each $inputs_x$ where $D1_{dc}$ produces a true value, $D1_{min}$ is defined to produce a zero and $D1_{max}$ is defined to produce a one.

In FIG. 1B, suitable minterm counting data representations of $D1_{dc}$, $D1_{min}$ and $D1_{max}$, referred to respectively as $D1_{dc,DREP}$, $D1_{min,DREP}$ and $D1_{max,DREP}$, are determined. Step 111. $D1_{dc,DREP}$, $D1_{min,DREP}$ and $D1_{max,DREP}$ can be determined provided the user has input at least two of $D1_{dc}$, $D1_{min}$ and $D1_{max}$. An example suitable data representation, for minterm counting, is a BDD. Regardless of the type of data structure used, it can be viewed as being representative of a set of minterms that can determine a functionality of $D1_{dc}$, $D1_{min}$ or $D1_{max}$.

FIG. 1B also depicts a step for determination of suitable minterm counting data representation for D2, referred to as $D2_{DREP}$. Step 112.

Prior to the production of $D1_{dc,DREP}$, $D1_{min,DREP}$, $D1_{max,DREP}$ and $D2_{DREP}$, the support of the sub-designs from each is determined (see Glossary for definition of support of sub-design). Each of these supports can be reduced by assigning binary values to some of the variables that would be included in the support. Step 110. Such selective conversion of input variables to fixed binary values involves two main steps, that can be performed separately or in an interdependent fashion: selection of the variables to remain symbolic and selection of the binary value to assign to each non-symbolic variable.

$D1_{min,DREP}$, $D1_{max,DREP}$ and $D2_{DREP}$ can each be assigned a minterm count, respectively $MC\_D1_{min,DREP}$, $MC\_D1_{max,DREP}$ and $MC\_D2_{DREP}$. Step 114. Determining a minterm count, for a data representation suitable for minterm counting, is equivalent to assigning an appropriate weighting to the set of minterms each such data structure represents.

A minterm count $MC\_D2_{min,DREP}$ can also be determined from $D1_{dc,DREP}$ and $D2_{DREP}$. Step 113.

If the following relations are satisfied, then D1 and D2 cannot be distinguished by the particular type of minterm counting applied:

$$\text{if} \begin{pmatrix} [mc(D1_{min}) = mc(D2 \wedge \neg D1_{dc})] \\ \text{AND} \\ [mc(D1_{min}) \le mc(D2) \le mc(D1_{max})] \end{pmatrix}$$

then keep D1 and D2 in same EC

The above relation (which corresponds, in FIG. 1B, to decision point 115) depicts two expressions, one on either side of an AND operator. The expression before the AND compares the MC of $D1_{min}$ to an expression (i.e., $D2 \wedge \neg D1_{dc}$) that determines the equivalent of $D2_{min}$. Alternatively, the expression before the AND can compare the MC of $D1_{max}$ to an expression (i.e., $D2 \vee D1_{dc}$) that determines the equivalent of $D2_{max}$.

If the expressions before and after the AND are determined to be true, then the relationship between D2 and D1 is consistent with D2 being within the range of functions encompassed by D1.

Even if D1 and D2, in a strict sense, represent different functionalities, it may still be the case that their functionalities are sufficiently related such that classification of D1 and D2 as differing functionalities is inappropriate. Each such test of relatedness, between a D1 and D2, is referred to herein as an "exception" since it can be an exception to the classification of D1 and D2 as differing functionalities. The evaluation of exceptions is represented in FIG. 1B by step 116. Detailed discussion, of the types of exceptions that can be evaluated in step 116, are presented below the following section: 6 ("Exceptions to MC, With Don't Cares").

1.2.1. Conjoining BDDs

If D2 and $\neg D1_{dc}$ are expressed as BDDs, taking their conjunction, to determine $D2_{min}$ (as called-for above), can be computationally expensive.

FIG. 11A-11B present an example pseudo-coded procedure, "ComputeWithCareSet," for performing the conjunction in a more efficient way. FIG. 11A is a version of ComputeWithCareSet for BDDs with potentially redundant nodes, while FIG. 11B is designed to operate on "reduced" BDDs (i.e., BDDs where redundant nodes are removed).

ComputeWithCareSet of FIG. 11A operates as follows (ComputeWithCareSet of FIG. 11B operates in a similar fashion). ComputeWithCareSet is initially invoked (line 4) with the "L" parameter set to zero, such that the variable closest to the root node, in BDDs F and C, is the starting node.

ComputeWithCareSet begins by addressing the following simple cases first. If the BDD for F or C represents a constant zero (line 7), the WMC of F and C is simply zero (line 8). If F represents a constant "1" (line 9) then the WMC of F and C is simply the WMC of C (line 10). Conversely, if C represents a constant "1" (line 11), then the WMC of F and C is simply the WMC of F (line 12).

If F and C do not fit one of the above simple cases, then ComputeWithCareSet is recursively invoked on the "then" (line 14) and "else" (lines 16-20) branches of the current variable as indicated by "L." The results of the recursive invocations are combined according to the WMC formula of FIG. 3A (line 22).

2. Ordinary Minterm Counting (OMC)

A known form of minterm counting is referred to herein as "ordinary" minterm counting or OMC. Application of OMC, to a suitable data representation of a sub-design, is as follows. OMC determines an integer that represents the sub-design. Regardless of how the integer is determined, it can be viewed as being equivalent to assigning a value of one to each minterm of the sub-design and computing the sum of all such assigned values.

While OMC is useful as a CDD, and can be determined rapidly, it can readily be appreciated there are many instances in which two sub-designs are functionally different but are still assigned the same integer value by OMC.

2.1. For BDDs

When the data representation is a BDD, and when the size of the support, of the sub-design represented by the BDD, is n, OMC can be accomplished as follows. Each constant "1" leaf node of the BDD can be assigned a weight of $2^n$. Each constant "1" leaf node, after passing through an inverted "else" edge, can be assigned a weight of zero. The weight of a parent BDD node (omc_parent) can be determined from the weight of its "then" and "else" edges (represented by wt_then and wt_else) by the following expression:

$$\text{omc\_parent} = \frac{(\text{wt\_then} + \text{wt\_else})}{2}$$

3. Weighted Minterm Counting (WMC)

Rather than assigning the same weight (e.g., a weight of one) to each minterm, weighted minterm counting (WMC) assigns a weight that can vary. Such weight can vary, for example, by being a function of the particular literals of which a minterm is comprised.

For example, a weight can be assigned to each variable, comprising a minterm, that is a function of the particular variable and whether the variable is required to be in true or complemented form. The function, that assigns a weight to each variable of a minterm, can be referred to as a variable-level weighting function (VLWF). Example VLWFs are discussed below.

The weights assigned to each variable of a minterm can be combined, according to an appropriate function (referred to as a minterm-level weighting function or MLWF), to arrive at a total weight for each minterm. An example MLWF is finding the product of the weights assigned to each variable of a minterm.

The minterm weights for a particular combinational sub-design can be combined, according to an appropriate function (referred to as a design-level weighting function or DLWF), to arrive at a total weight for the sub-design. An example DLWF is to take the sum of the weights assigned to each minterm.

3.1. Example VLWFs

For a combinational design that is a function of n variables, for each minterm m, each of its variables v can be identified by a value i, where $0 \leq i \leq (n-1)$. The type of literal $l_i$ representing each variable $v_i$ (i.e., whether the literal that represents the variable in its true or complemented form) can be represented by the following binary vector:

$$b_{n-1}, b_{n-2}, \ldots b_1, b_0$$

Where $b_i=0$ means the corresponding variable $v_i$ is represented in its complemented form by $-l_i$, and $b_i=1$ means the corresponding variable $v_i$ is represented in its true form by $l_i$.

A VLWF for assigning a variable weight v_wt$_i$ to a variable $v_i$ of a minterm m, can be represented as follows:

$$\text{v\_wt}_i = \text{VLWF}(i, b_i), \text{ for } 0 \leq i \leq (n-1)$$

The class of functions for VLWF can be further constrained to those that satisfy any combination of the following three constraints:

$$\text{v\_wt}_i = 1 \text{ when } b_i = 0 \quad (1)$$

$$\text{v\_wt}_i \neq 0 \text{ and } \text{v\_wt}_i \neq -1 \quad (2)$$

each v_wt$_i$ is given a unique value when $b_i=1$ (3)

Constraints (1) and (2) can be particularly useful when the MLWF is multiplication. When a multiplication MLWF is used, a problem can be the weight for a minterm m, expressed as wt_m, becoming too large for convenient representation in a computing system. This can be addressed by further limiting each variable weight v_wt$_i$ to a value that is close to one. Each weight v_wt$_i$ can differ from its next consecutive weight v_wt$_{i+1}$ by a fixed amount (e.g., 0.01). Therefore, an example sequence of weights can be as follows:

1.00, 1.01, 1.02, . . . .

Multiplication of floating point values can produce rounding errors. Such errors can compound when producing an overall weight for a D1 and an overall weight for a D2. The errors can cause the weight for the D1 to appear different from the weight for the D2 when, in fact, the difference is just due to rounding errors. A technique for addressing this problem is to require that the weights, for D1 and D2, differ by at least a predetermined tolerance before it is concluded that the two combinational designs are functionally different. An example tolerance is $10^{-20}$.

3.2. Example Sub-Design

An example sub-design f to which WMC can be applied is as follows:

$$f = v_0 + v_1 \bar{v}_2$$

Figures 2A, 2B:
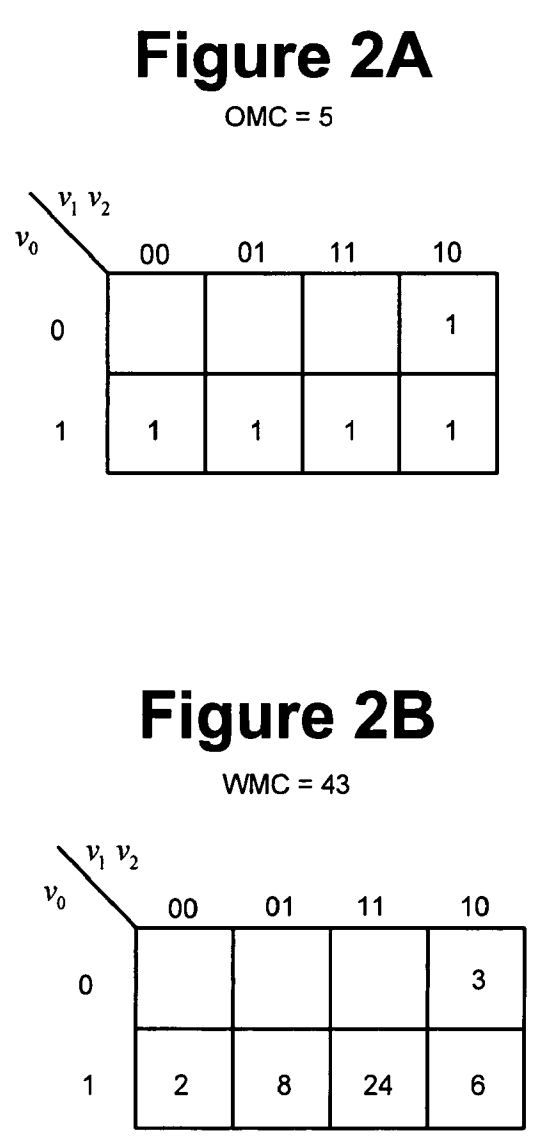

The minterms of f can be represented, in a form suitable for OMC, by the Karnaugh map of FIG. 2A.

An example VLWF for f, VLWF$_{ex1}$, can be as follows:

$$\text{v\_wt}_i = \text{VLWF}_{ex1}(i, b_i), \text{ for } 0 \leq i \leq 2, \text{ where}$$

$$\text{v\_wt}_i = 1 \text{ when } b_i = 0 \quad (1)$$

$$\text{v\_wt}_0 = 2 \text{ when } b_0 = 1 \text{ and } i = 0 \quad (2)$$

$$\text{v\_wt}_1 = 3 \text{ when } b_1 = 1 \text{ and } i = 1 \quad (3)$$

$$\text{v\_wt}_2 = 4 \text{ when } b_2 = 1 \text{ and } i = 2 \quad (4)$$

When the above-defined VLWF$_{ex1}$ is combined with an example MLWF, MLWF$_{ex1}$, of multiplication and an example DLWF, DLWF$_{ex1}$, of addition, the resulting weighted Karnaugh map is shown in FIG. 2B.

3.3. Application To BDDs

Where a sub-design is expressed as a BDD, and where the VLWF, MLWF and DLWF to be applied are known, a suitable set of expressions, for the efficient determination of the BDD's WMC, can be determined.

In this section, a set of expressions is presented for the case where the DLWF is summation, the MLWF is multiplication and the VLWF satisfies constraints (1) and (2). The variables of the sub-design are $v_0$ to $v_{n-1}$, where $v_0$ is represented by the root node and $v_{n-1}$ is represented by the BDD nodes closest to the constant "1" nodes.

3.3.1. Example Expressions

A suitable set of expressions, for the determination of a BDD's WMC, is shown in FIGS. 3A-3E.

FIG. 3A defines an expression to determine a value for wmc(nd$_p$), where nd$_p$ is a node p of a BDD and wmc(nd$_p$) is the WMC of that node. wmc(nd$_p$) can be applied to any node of a BDD, except for the constant "1" nodes. wmc_t(nd$_p$) finds the WMC of the "then" branch of nd$_p$, while wmc_e(nd$_p$) find the WMC of the "else" branch of nd$_p$. nd2v(nd$_p$) returns the variable $v_i$ represented by node nd$_p$. v2wt($v_i$) returns the weight assigned to variable $v_i$.

FIG. 3B defines an expression to determine wmc_t(nd$_p$). nd$_{then}$ is the "then" node pointed-to by nd$_p$. p2con_adj_fac(i) and p2chi_adj_fac(i, j) are adjustment factors defined in, respectively, FIGS. 3D and 3E. As can be seen in FIG. 3B, the value determined by wmc_t(nd$_p$) depends upon whether nd$_{then}$ is a constant "1" node. If it is, then its WMC is $2^n$ scaled by an adjustment factor. As can be seen in FIG. 3D, if nd$_p$ is already at the maximum BDD depth of n–1 (i.e., the i value passed to p2con_adj_fac is n–1), the adjustment factor is simply "1." However, if nd$_p$ is not at the maximum BDD depth, p2con_adj_fac scales $2^n$ appropriately.

If nd$_{then}$ is not a constant "1," then its WMC is that of wmc recursively applied to nd$_{then}$, scaled by an adjustment factor. As can be seen in FIG. 3E, the adjustment factor depends upon the difference between the level of nd$_p$ and nd$_{then}$. If nd$_{then}$ is a direct parent of nd$_p$ (i.e., the difference between their BDD levels is one), a scaling factor is not needed and so p2chi_adj_fac returns one. However, if nd$_p$ and nd$_{then}$ are not directly consecutive BDD levels, p2chi_adj_fac scales wmc (nd$_{then}$) appropriately.

FIG. 3C defines an expression to determine wmc_e(nd$_p$). nd$_{else}$ is the "else" node pointed-to by nd$_p$. FIG. 3C is more complex than FIG. 3B because the "else" edge of a BDD can be inverted while, according to typical BDD notation, the "then" branch cannot be inverted. The combination of whether nd$_{else}$ is a constant "1," with whether the edge between nd$_p$ and nd$_{else}$ is inverted, admits of four possibilities. For the two possibilities where the edge between nd$_p$ and nd$_{else}$ is not inverted, operation of wmc_e(nd$_p$) is the same as wmc_t(nd$_p$), except that nd$_{else}$ is substituted for nd$_{then}$.

For the two possibilities where the edge between nd$_p$ and nd$_{else}$ is inverted, wmc_e(nd$_p$) works as follows. If nd$_{else}$ is a constant "1" node, then wmc_e(nd$_p$) is zero. If nd$_{else}$ is not a constant "1" node, then wmc_e(nd$_p$) is determined as follows. The WMC for nd$_{else}$, where nd$_{else}$ is a constant "1" node connected to nd$_p$ through a non-inverted edge, is determined. From this is subtracted the following: the WMC for nd$_{else}$, where nd$_{else}$ is not a constant "1" node and connected to nd$_p$ through a non-inverted edge.

3.3.2. Example Pseudo-Code

FIGS. 4A-4E present example pseudo-code for implementing the expressions of FIGS. 3A-3E. The pseudo-code of FIG. 4A corresponds to the expression of FIG. 3A. The pseudo-code of FIG. 4B corresponds to the expression of FIG. 3B. The pseudo-code of FIG. 4C corresponds to the expression of FIG. 3C. The pseudo-code of FIG. 4D corresponds to the expression of FIG. 3D. The pseudo-code of FIG. 4E corresponds to the expression of FIG. 3E.

3.3.3. Example BDDs

Figure 5A:
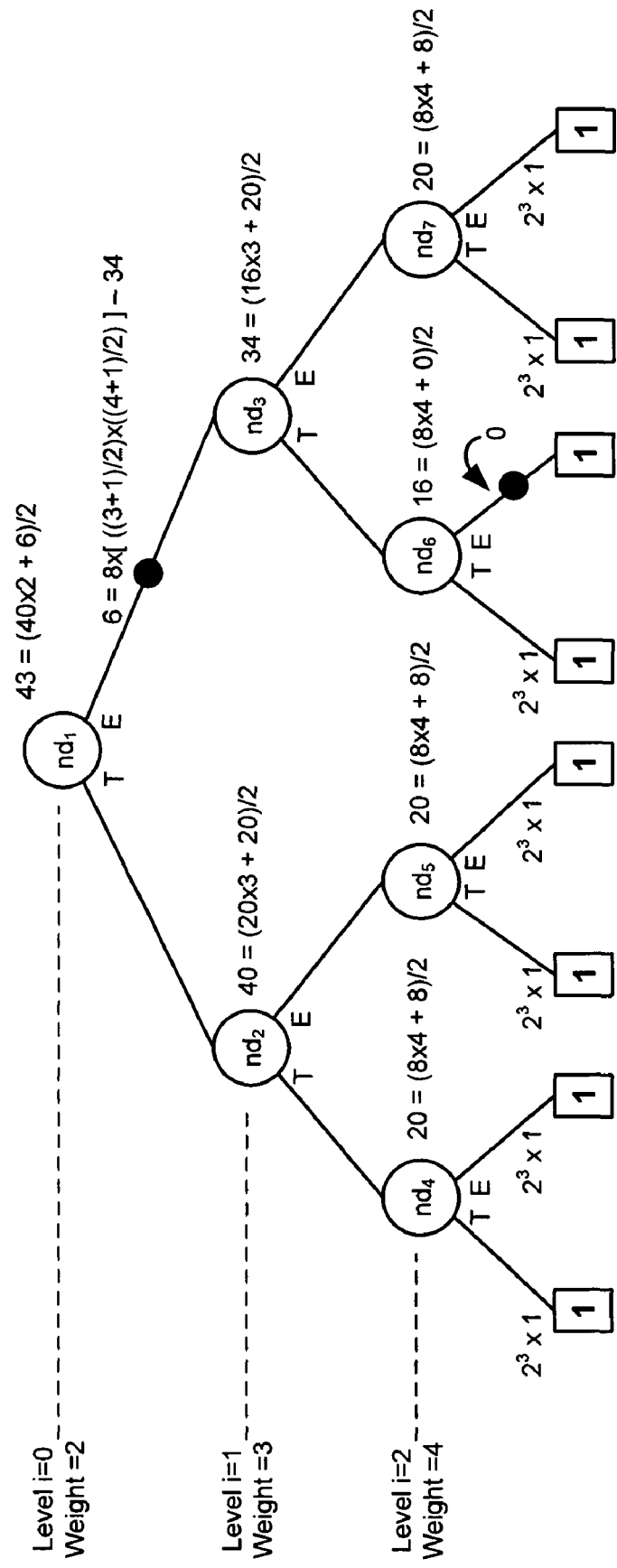
FIG. 5A depicts an example BDD to which the expressions of FIGS. 3A-3E have been applied.
Figure 5B:
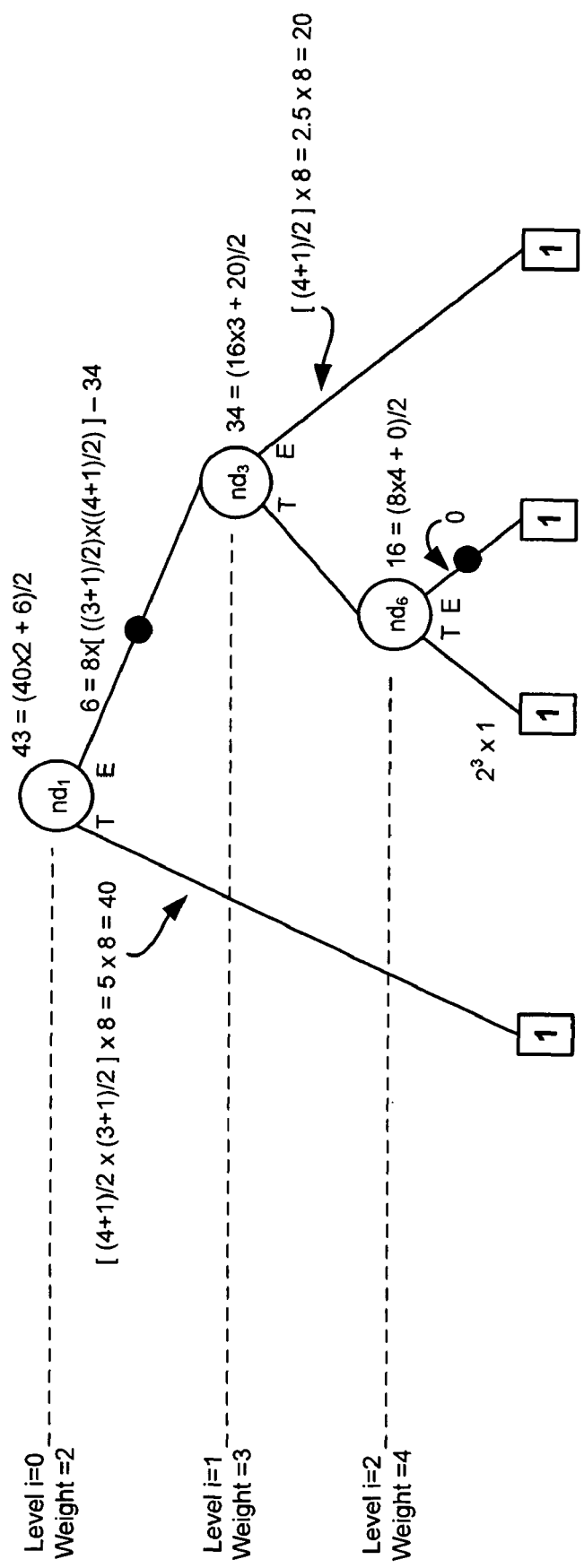
FIG. 5B depicts another example BDD to which the expressions of FIGS. 3A-3E have been applied.

FIG. 5A depicts an example BDD to which the expressions of FIG. 3A-3E have been applied along with $VLWF_{ex1}$, $MLWF_{ex1}$ and $DLWF_{ex1}$. FIG. 5B depicts another example BDD to which the expressions of FIG. 3A-3E have been applied. The BDD of FIG. 5B differs from the BDD of FIG. 5A in that the redundant nodes of FIG. 5A have been eliminated. Non-redundant BDDs can provide a more efficient representation of a function. The BDDs of FIGS. 5A and 5B represent the same function, shown in Karnaugh map form, as FIG. 2B.

4. Exceptions to OMC, without Don't Cares

Even if OMC indicates D1 and D2 are different, there can be exceptions to classifying the designs into different equivalence classes. The two basic types of exceptions are: output inversion and input inversion. These two basic types of exceptions can be combined to produce a total of three exception types. Each of these exception types is addressed below.

Some of the functions, used for defining the below exceptions, are defined in section 7 ("Functions For Defining Exceptions").

4.1. Output Inversion

The output inversion exception can be expressed as follows: D1 is consistent with being the same as D2, except that the output of D2 is inverted with respect to the output of D1.

The output inversion exception can be tested-for as follows. Determine a design that determines the inverse functionality of D2 (i.e., −D2). Compare omc(D1) to omc(−D2) (see FIG. 6A). Alternatively, omc(−D2) is equivalent to the expression shown in FIG. 6B, which can be more efficient to determine.

4.2. Input Inversion

Using known techniques, one can determine the following: whether, as a necessary-but-insufficient condition for equivalency between D1 and D2, a pair of corresponding inputs, one input applied to D1 and the other input applied to D2, must be inverted with respect to each other. Such detection of necessary-but-insufficient input inversion can be accomplished, for example, as described in the J. Mohnke and S. Malik paper (see Glossary for citation to paper). However, the J. Mohnke and S. Malik paper discusses building a BDD for an entire circuit design, which can be intractable when the circuit design is too large. This shortcoming can be addressed by applying the methods of the J. Mohnke and S. Malik paper to a pair of combinational sub-designs where only some of the inputs are kept symbolic and the rest are assigned binary values.

Each pair of inputs identified as needing to be inverted, as a necessary-but-insufficient condition, can then be further tested to determine whether the pair is consistent with being inverted when tested according to OMC. If all such pairs are consistent with being inverted according to OMC, then D1 and D2 can be kept in the same equivalence class.

An example expression, for application of OMC, is shown in FIG. 6C. The expression of FIG. 6C assumes that D1 and D2 share the same set of variables $v_0$ to $v_{n-1}$, where k of the variables, referred to as $v_0$ to $v_{k-1}$, have been identified, as a necessary-but-insufficient condition, as needing to be input inverted between the two combinational sub-designs. For each of these k variables, FIG. 6C contains one expression within square brackets that tests whether a pair of inputs is, in fact, consistent with being input inverted according to OMC.

4.3. Output Inversion and Input Inversion

As discussed above, each pair of inputs identified as needing to be inverted, as a necessary-but-insufficient condition, can be further tested to determine whether the pair is consistent with being inverted when tested according to OMC. In addition, the outputs of the two combinational sub-designs can be compared, using OMC, to determine whether they are consistent with being output inversions of each other.

An example expression, for application of OMC, is shown in FIG. 6D.

5. Exceptions to WMC, without Don't Cares

Even if WMC indicates that D1 and D2 are different, there can be exceptions to classifying the sub-designs into different equivalence classes. The two basic types of exceptions are: output inversion and input inversion. The two basic types of exceptions can be combined to produce a total of three exception types. Each of these three exception types is addressed below.

Some of the functions, used for defining the below exceptions, are defined in below section 7 ("Functions For Defining Exceptions").

In considering the below-presented exceptions, each "equality" tested-for, between a pair of WMCs, can also be satisfied by the operands being within a tolerance of each other.

5.1. Output Inversion

The output inversion exception can be expressed as follows: D1 cannot be distinguished from the inverse functionality of D2 (i.e., −D2). See FIG. 7A where wmc(D1) is compared to wmc(−D2).

Alternatively, wmc(−D2) is equivalent to the expression shown in FIG. 7B, which can be more efficient to determine. FIG. 7B is comprised of two expressions. The second expression determines WMC for a function of n variables that represents a constant "1." The second expression of FIG. 7B iterates over each variable of D2. For each variable of D2, its adjusted weight is determined (one is added to the weight and the sum is divided by two). The product of the adjusted weights is determined, which is multiplied by an adjustment factor (the OMC for a function of n variables that represents a constant "1")

5.2. Input Inversion

As discussed above in section 4.2 ("Input Inversion" with OMC), using known techniques one can determine which pairs of inputs between two sub-designs, as a necessary-but-insufficient condition for equivalency between the two sub-designs, must be inverted with respect to each other.

Each pair of inputs identified as needing to be inverted, as a necessary-but-insufficient condition, can then be further tested to determine whether the pair is consistent with being inverted when tested according to WMC. If all such pairs are consistent with being inverted according to WMC, then D1 and D2 can be kept in the same equivalence class.

An example expression, for application of WMC, is shown in FIG. 7C. The expression of FIG. 7C assumes D1 and D2 share the same set of input variables $v_0$ to $v_{n-1}$ and that k of the variables, referred to as $v_0$ to $v_{k-1}$, have been identified, as a necessary-but-insufficient condition, as needing to be input inverted between the two combinational sub-designs. For each of these k variables, FIG. 7C contains one expression within square brackets that tests whether a pair of inputs is, in fact, consistent with being input inverted according to WMC.

5.3. Output Inversion and Input Inversion

As discussed above in section 5.2, each pair of inputs identified as needing to be inverted, as a necessary-but-insufficient condition, can be further tested to determine whether the pair is consistent with being inverted when tested according to WMC. In addition, the outputs of the two combinational sub-designs can be compared, using WMC, to determine whether they are consistent with being output inversions of each other.

An example expression, for application of WMC, is shown in FIG. 7D.

6. Exceptions to MC, with Don't Cares

When an MC is applied with D1 having a don't care specification, even if the MC indicates that D1 and D2 are different, there can be exceptions to classifying the sub-designs into different equivalence classes. The two basic types of exceptions are: output inversion and input inversion. The two basic types of exceptions can be combined to produce a total of three exception types. Each of these three exception types is addressed below.

Some of the functions, used for defining the below exceptions, are defined in below section 7 ("Functions For Defining Exceptions").

In considering the below-presented exceptions, each "equality" tested-for, between a pair of WMCs, can also be satisfied by the operands being within a tolerance of each other.

6.1. Output Inversion

An expression to test for output inversion with OMC is essentially identical to an expression to test for output inversion with WMC. The only difference is the OMC test (see example of FIG. 8A) being expressed in terms of an OMC function and the WMC test (see example of FIG. 8B) being expressed in terms of a WMC function.

Further, the OMC and WMC expressions to test for output inversion are essentially identical to the expression, presented above in section 1.2 ("With Don't Cares") in connection with step 115 of FIG. 1B, for applying MC with don't cares. The only difference is that each instance of D2 is replaced with $-D2$.

6.2. Input Inversion

As discussed above, a set of k input variables can be determined, as a necessary-but-insufficient condition for equivalency between two sub-designs, as needing to be inverted with respect to each other.

Given the set of k input variables, an expression to test, with OMC, whether those variables are consistent with being input inverted, is presented in FIG. 9A.

Given the set of k input variables, an expression to test, with WMC, whether those variables are consistent with being input inverted, is presented in FIG. 9B.

As can be seen, FIG. 9A is similar to FIG. 9B. The two differences are as follows. FIG. 9A is expressed in terms of an OMC function and FIG. 9B is expressed in terms of a WMC function. FIG. 9B determines a phase-shifted WMC, of a conjunction, while FIG. 9A determines a non-phase-shifted OMC of a conjunction.

6.3. Output Inversion and Input Inversion

FIG. 10A is the same as FIG. 9A, except each instance of D2 is inverted. Likewise, FIG. 10B is the same as FIG. 9B, except each instance of D2 is inverted.

7. Functions for Defining Exceptions cofac(D, v_st): Finds the co-factor of a design D. The co-factor found is the design defined by design D when its variable v is in state v_st.

sub(D, sub_$v_0$, sub_$v_1$, ... sub_$v_{k-1}$): The operation of sub, also referred to herein as a "substitution" operation, can be defined as follows. If design D is expressed as a Boolean formula, for each occurrence of a variable sub_$v_x$ in D, where $0 \leq x \leq k-1$, sub_$v_x$ is replaced with $-$sub_$v_x$ and $-$sub_$v_x$ is replaced with sub_$v_x$.

wmc_ps(D, ps_$v_0$, ps_$v_1$, ... ps_$v_{k-1}$): Finds the WMC of a design D, but with variables ps_$v_0$, ps_$v_1$, ... ps_$v_{k-1}$ phase shifted. Such phase shifting can be defined as follows. Design D can be expressed as a collection of minterms. For each minterm, its weight, for purposes of determining WMC, can be found by multiplying the value of each literal, composing the minterm, by the weight of the variable represented by the literal. Literals representing the "true" form of a variable become the value one multiplied by the weight of the variable represented by the literal. If the literal represents a variable that is an element of ps_$v_0$, ps_$v_1$, ... ps_$v_{k-1}$, then the phase of the value one, used for multiplying with the weight of the variable, is shifted 180 degrees to be a zero. Literals representing the "negated" form of a variable become the value zero multiplied by the weight of the variable represented by the literal. If the literal represents a variable that is an element of ps_$v_0$, ps_$v_1$, ... ps_$v_{k-1}$, then the phase of the value zero, used for multiplying with the weight of the variable, is shifted 180 degrees to be a one.

8. Partial BDD Production

A D1 and D2 may be too large for complete conversion into a BDD representation. However, since the goal of analyzing the BDDs, that represent D1 and D2, is to determine whether D1 and D2 are different, it is not necessary for the entirety of D1 and D2 to be converted into the BDD form. Heuristic approaches can be used to select the appropriate portions of D1 and D2, for conversion into BDDs, such that the ability to distinguish D1 and D2 will be preserved.

Without loss of generality, it will be assumed that D1 and D2 both accept n inputs. Some of those n inputs are m state bits. One of the sub-designs (for purposes of example D1 is selected) is used for guiding the partial BDD construction. A first compare design, from which D1 can be drawn, can be represented by m such sub-designs, each of which determines the value of a state bit. For those sub-designs in a same EC, their outputs, when present among the n inputs, can be treated as a single input.

Of the n inputs to D1, k inputs (where $k \leq n$) can be selected to remain as symbolic variables, with the remaining n–k inputs assigned a literal binary value. Selection of the k inputs can be accomplished by any suitable method, including heuristically-guided methods. Selection of binary values for the remaining n–k inputs can be accomplished by any suitable method, including heuristically-guided methods. Symbolic variables can be selected in conjunction with selection of binary values, or the two can be accomplished by separate processes.

8.1. Symbolic Variable Selection

An example heuristically-guided method for symbolic variable selection is as follows.

For each of the n inputs, $i_0 \ldots i_{n-1}$, its transitive fanout, with respect to the complete first compare design, can be determined such that the number of state bits, driven by that input, can be determined. The number of state bits, driven by each input, can be expressed as $nsb_0 \ldots nsb_{n-1}$, where each $nsb_x$ ($0 \leq x \leq n-1$) corresponds to an $i_x$ ($0 \leq x \leq n-1$).

Inputs $i_0 \ldots i_{n-1}$ can be put in ascending order according to their corresponding $nsb_0 \ldots nsb_{n-1}$ values. The k inputs, to be selected for keeping in symbolic form, can be selected from the ordered list so as to insure that an even distribution, of the $nsb_0 \ldots nsb_{n-1}$ values, is selected. A "gap value" G can be determined as follows: G=n/k. Starting from one end of the ordered list of inputs, every Gth input can be selected to remain symbolic.

8.1.1. Example

Figure 12A:
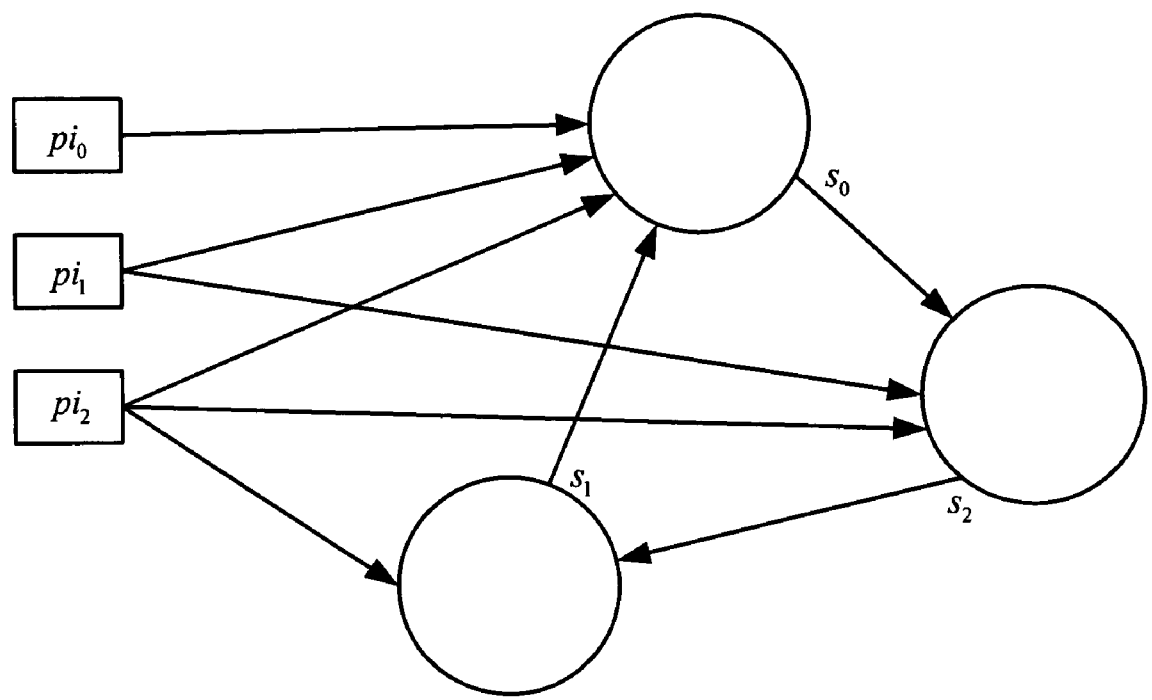
FIGS. 12A-12C depict an example of symbolic variable selection.
Figure 12B:
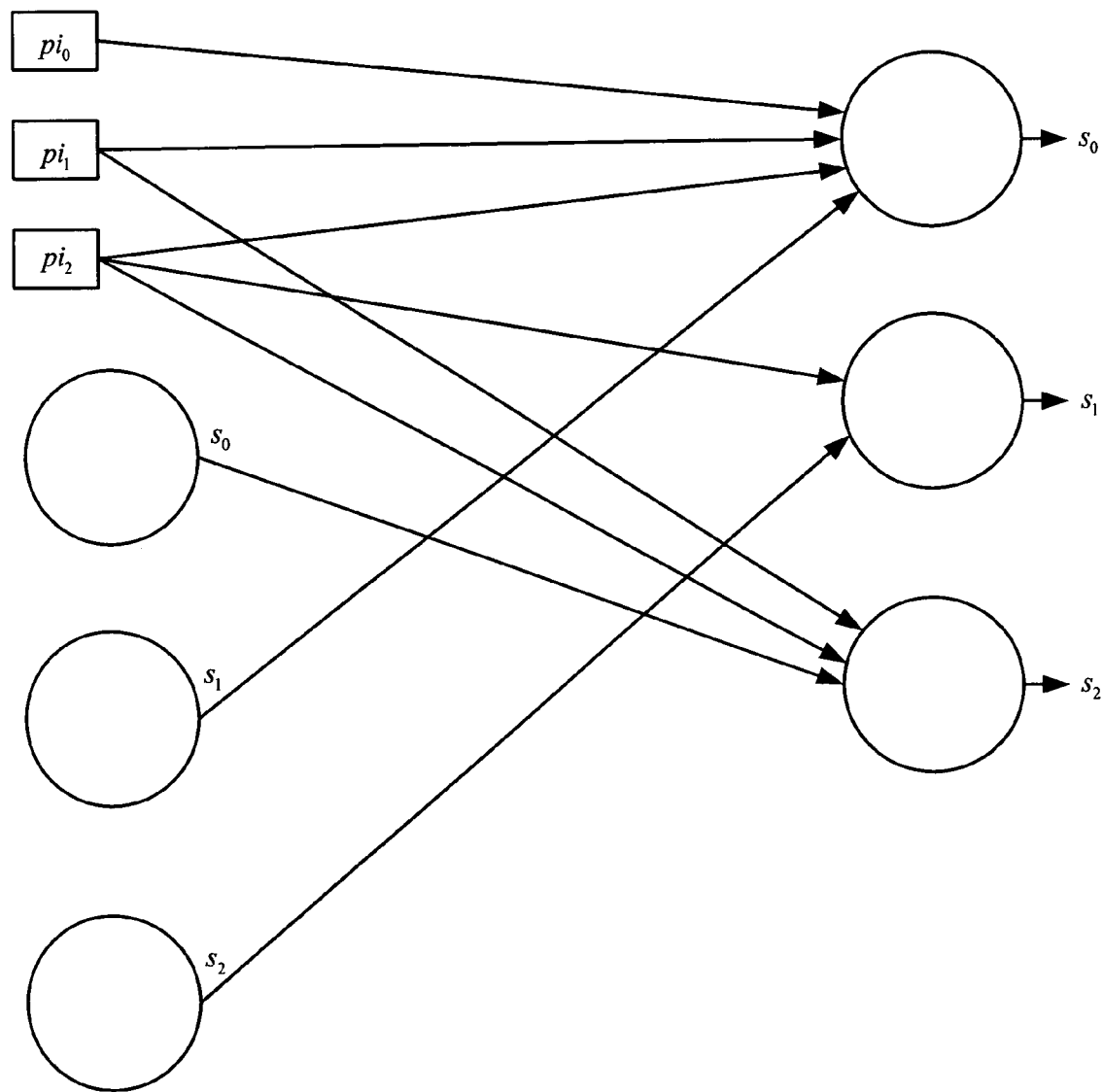
Figure 12C:
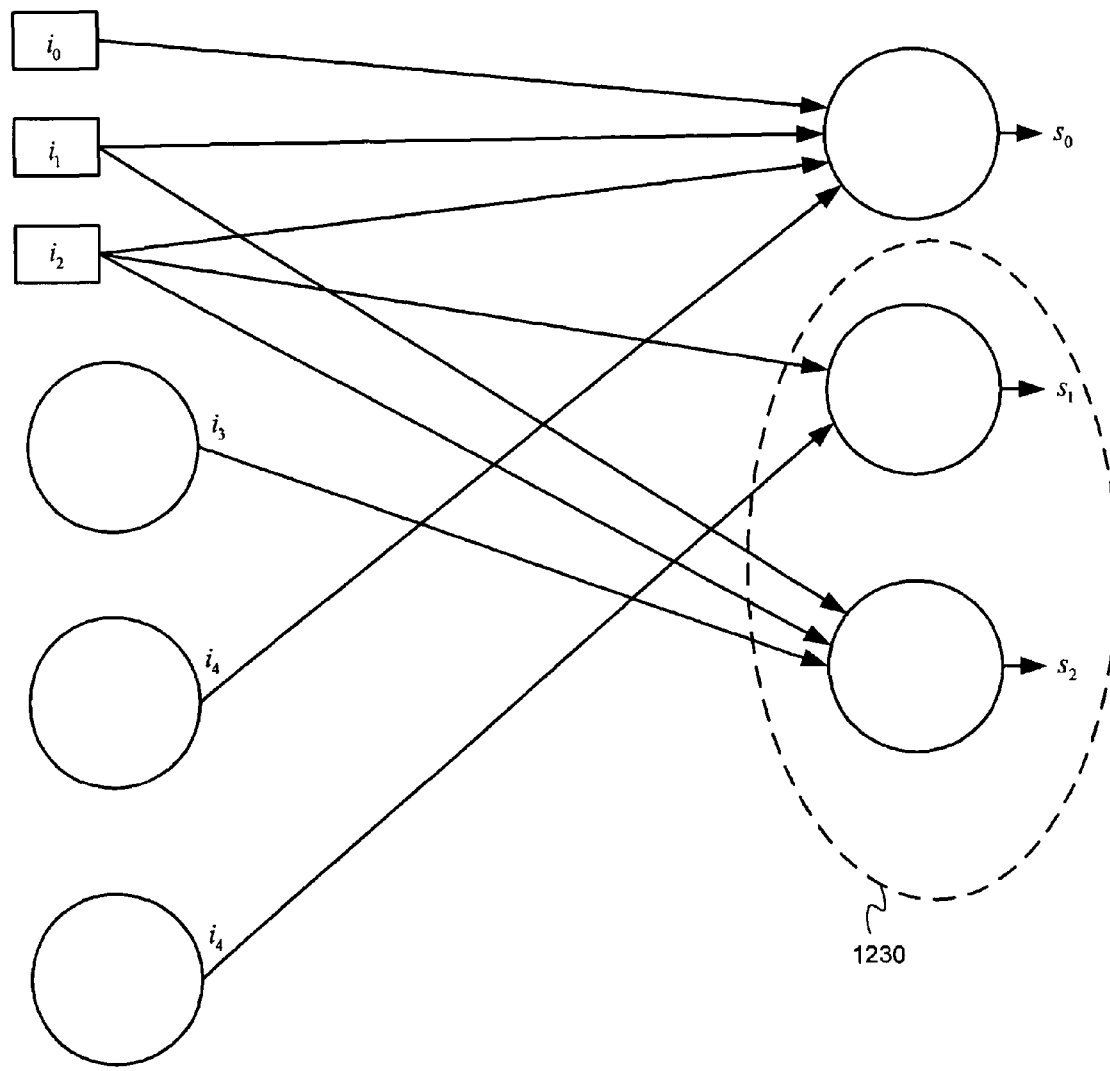

An example of symbolic variable selection is depicted in FIGS. 12A-12C. FIG. 12A depicts an example sequential circuit comprised of three state bits: $s_0$, $s_1$, $s_2$. Each of these state bits is driven by its own circular symbol in FIGS. 12A-12C. Each circular symbol has a single output, representing the current state of its one state bit. Each circular symbol can have multiple inputs since it also encompasses the combinational sub-design that determines the next state for that one state bit.

The example sequential circuit of FIG. 12A also includes three primary inputs: $pi_0$, $pi_1$, $pi_2$. In FIG. 12B, the circuit of FIG. 12A is rearranged into a bipartite graph where all inputs, that can effect the next state, are on the left side and each state bit, along with its combinational next state function, is on the right side.

In FIG. 12C, the inputs to each combinational sub-design are renamed as follows. It is assumed that the sub-designs for $s_1$ and $s_2$ are currently in the same EC, as indicated by dashed outline 1230. Primary inputs $pi_0$, $pi_1$, $pi_2$ are re-named: $i_0$, $i_1$, $i_2$. Present state input $s_0$ is re-named $i_3$ while present state inputs $s_1$, $s_2$ are re-named $i_4$. The corresponding values of $nsb_0$, $nsb_1$, $nsb_2$, $nsb_3$, $nsb_4$, for $i_0$, $i_1$, $i_2$, $i_3$, $i_4$, are: 1, 2, 3, 1, 2. In ascending order, the inputs, and the number of state bits driven by each, are $i_0$, $i_3$, $i_1$, $i_4$, $i_2$ and 1, 1, 2, 2, 3. If k=2, G=n/k=5/2=2.5 If G is rounded down to 2, then the primary inputs selected to remain symbolic are: $i_0$, $i_1$. If G is rounded up to 3, then the primary inputs selected to remain symbolic are: $i_0$, $i_4$.

8.2. Binary Value Selection

The remaining n−k inputs can each be assigned a literal binary value by any appropriate method. An example method is as follows.

The n−k inputs can be assigned non-controlling values, depending upon the types of gates each controls. For example, for a 2-input AND gate, the logic value "1" is non-controlling since it permits the other logical value, at the other input to the AND gate, to have an observable effect on the AND gate's output. Similarly, for a 2-input OR gate, the logic value "0" is non-controlling.

When assigning non-controlling values, any appropriate method can be used to determine the order in which non-controlling values are assigned and the "neighborhood" of gates, associated with each of the n−k inputs, used for determining whether a value is non-controlling.

A strategy, that can be applied when assigning non-controlling values, is to select values that will allow the k symbolic inputs to each have, as much as possible, an observable effect on the m state bits. An example implementation of this strategy is as follows.

For each sub-design, a depth-first search, starting at the sub-design's state-bit, is performed in order to create a BDD representation of the sub-design. During the course of each depth-first search, when each of the n−k inputs is encountered, it is given a non-controlling value based upon the type of gate that was last traversed.

8.2.1. Example Pseudo-Code

An example pseudo-coded procedure, for performing such binary value assignment, is discussed below in section 9.4 entitled "BuildBddInEqClass." The pseudo-code itself is presented in FIGS. 19A-19B.

9. Example Application of WMC

9.1. Distinguish_Designs

FIG. 13 presents a pseudo-code procedure "distinguish_designs" that accepts a first and second compare designs, each of which is comprised of m sub-designs. The sub-designs of the first compare design can be represented as follows:

$$D1_0(i_0, i_1, \ldots i_{n-1}), D1(i_0, i_1, \ldots i_{n-1}), \ldots D1_{m-1}(i_0, i_1, \ldots i_{n-1})$$

The sub-designs of the second compare design can be represented as follows:

$$D2_0(i_0, i_1, \ldots i_{n-1}), D2(i_0, i_1, \ldots i_{n-1}), \ldots D2_{m-1}(i_0, i_1, \ldots i_{n-1})$$

If distinguish_designs is successful in its application of WMC, each EC, of the $EC_{all}$ returned, should contain two sub-designs that constitute a combinational design pair.

As discussed above, a potential application of distinguish_designs is the sequential equivalence problem. If all combinational design pairs are equivalent, it can be concluded that the first and second compare designs are equivalent.

Each sub-design passed to distinguish_designs (see FIG. 13, line 1) accepts n input variables. Each sub-design represents the next-state function for one-bit of state storage. Therefore, the first and second compare designs are each assumed to have m state bits.

Initially, distinguish_designs puts all sub-designs, of the first and second compare designs, into a single EC called $EC_{one}$. Lines 3-5. Initially, $EC_{one}$ becomes the first member of $EC_{all}$. Lines 6-7.

The procedure "BreakEqClassWithOmc" is called (line 13) to divide $EC_{one}$ into the largest numbers of ECs possible, given the functional distinguishing capability of OMC. Next, "BreakEqClassWithWmc" is used (line 21), on each member of $EC_{all}$, in order to apply the additional functional distinguishing capability of WMC.

9.2. BreakEqClassWithOmc

FIG. 14 presents a pseudo-code procedure "BreakEqClassWithOmc." BreakEqClassWithOmc begins by testing whether $EC_{one}$ is already composed of just two sub-designs. Line 6.

If not, a BDD is generated for each sub-design of $EC_{one}$. Line 17. However, depending on the size of the first and second compare designs, there may be too many variables for production of the BDD. In this case, a procedure, such as the "ChooseSymbolicVariables" procedure invoked at line 11, can be used to select a subset of the variables of $EC_{one}$ (referred to in FIG. 14 as $V_s$) to remain symbolic. $EC_{all}$ is also passed to ChooseSymbolicVariables to identify which groups of state bits are currently to be treated as a single input for each sub-design of $EC_{one}$. While a pseudo-coded procedure for ChooseSymbolicVariables is not presented, a functional specification of ChooseSymbolicVariables is presented in above section 8.1 ("Symbolic Variable Selection").

A BDD for each sub-design of $EC_{one}$ can be produced by calling BuildBddInEqClass. Line 17. BuildBddInEqClass can operate by performing a depth-first search of each sub-design. During such depth-first search, variables that are to be non-symbolic can have binary values assigned.

A procedure "FindMatchWithOmc" can be called to determine whether $EC_{one}$ can be subdivided, into smaller ECs, with OMC. Line 21. The subdivisions are stored in "NewEC." If $EC_{one}$ cannot be further subdivided, FindMatchWithOmc returns an unchanged $EC_{all}$. If $EC_{one}$ can be further divided, $EC_{all}$ is updated as follows: $EC_{one}$ is removed from $EC_{all}$ and the ECs of NewEC are added to $EC_{all}$. Line 28.

Then, for each EC of NewEC (referred to in the pseudo-code as $EC_{cur}$), BreakEqClassWithOmc is called recursively (line 36) to determine whether $EC_{cur}$ can be further subdivided with OMC. In effect, BreakEqClassWithOmc may be able to find further subdivisions of $EC_{one}$, once $EC_{one}$ has already been partially subdivided with OMC, because the partial subdivision has introduced new variables that can change how FindMatchWithOmc operates.

9.3. FindMatchWithOmc

FIG. 15 presents a pseudo-code procedure "FindMatch-WithOmc." FindMatchWithOmc is passed an EC $EC_{one}$. Line 1. For each sub-design of $EC_{one}$ (line 7) the parameter "BDD" of FindMatchWithOmc contains a corresponding BDD.

The new subdivisions of $EC_{one}$, that FindMatchWithOmc is able to find, are stored in NewEC which is initialized to an empty set.

For each sub-design $D_i$ of $EC_{one}$ a "for" loop (lines 7-39) can cause the following to be done.

The OMC of $D_i$, called omc_$D_i$, can be found with "find_OMC." Line 11.

A set called matches_$D_i$ can be found. Line 14. matches_$D_i$ is the set of ECs, in NewEC, that match omc_$D_i$. If don't cares are not represented by the sub-designs, then "matching," between an OMC value omc_$D_i$ and an EC $NewEC_i$ of NewEC, can be defined as follows. Since the sub-designs of $NewEC_i$ do not represent don't cares, each sub-design of $NewEC_i$ (which can be referred to as $NewEC_{i,s}$) has the same OMC value that shall be referred to as omc_$NewEC_i$. omc_$D_i$ matches omc_$NewEC_i$ if they are numerically equal.

If the sub-designs of $NewEC_i$ do represent don't cares, each sub-design $NewEC_{i,s}$ of $NewEC_i$ can have a min and max value (that can be referred to as min_$NewEC_{i,s}$ and max_$NewEC_{i,s}$). Also, the OMC for $D_i$ can be expressed as the following two values: min_omc_$D_i$ and max_omc_$D_i$. min_omc_$D_i$ and max_omc_$D_i$ can be regarded as a range (referred to herein as the "don't care range" for $D_i$). Similarly, for each sub-design $NewEC_{i,s}$ of $NewEC_i$, its min_$NewEC_{i,s}$ and max_$NewEC_{i,s}$ can be regarded as a range (referred to herein as a "don't care range").

A $NewEC_{i,s}$ is a member of $NewEC_i$, because between it, and any other member $NewEC_{i,s2}$ of $NewEC_i$, there is either overlap between the don't care ranges of $NewEC_{i,s}$ and $NewEC_{i,s2}$ or, transitively, in combination with other sub-designs of $NewEC_i$, there is overlap between the don't care ranges of $NewEC_{i,s}$ and $NewEC_{i,s2}$. Therefore, a $D_i$ is added to $NewEC_i$ if the don't care range of $D_i$ overlaps the don't care range of any sub-design that is already a member of $NewEC_i$.

If there are no ECs for which the OMC of $D_i$ matches ("if" of line 16 tests true), then a new EC, just for $D_i$, is started (take action of line 20). Otherwise, the following steps are performed (see "else" of lines 21-38). The ECs that match the OMC of $D_i$ are combined, along with $D_i$, to produce a new EC called "NewElement." Line 35. The ECs that match the OMC of $D_i$ are removed from NewEC. Line 32. NewElement is added to NewEC. Line 37.

9.4. BuildBddInEqClass

FIGS. 19A-19B present a pseudo-code procedure "BuildBddInEqClass." BuildBddInEqClass takes as input an equivalence class "EC" of sub-designs and a set of variables "$V_s$" that are to remain symbolic. Line 3, FIG. 19A. For each sub-design "F" of EC, BuildBddInEqClass applies BuildBdd. Lines 8-11, FIG. 19A.

BuildBdd takes three parameters (see line 19, FIG. 19A, for beginning of definition of BuildBdd): a point "F" in a design to be converted to a BDD, the location of a parent "P" to point "F" and the set $V_s$ of variables that are to remain symbolic. BuildBdd does the actual recursive, depth-first, traversal of a sub-design "F."

BuildBdd begins by testing whether a BDD has already been constructed for "F." Lines 22-23, FIG. 19A. If not, the case of "F" representing an input is addressed (see lines 27-45, FIG. 19A). If "F" represents a variable that is to remain symbolic (i.e., the "if" of line 30, FIG. 19A, test true), a BDD node, representing the variable of $V_s$ represented by "F," can be generated. Line 31. Otherwise, "F" is to be assigned a binary value (see "else" of lines 32-43).

The case of "F" being an AND or OR is also addressed. Line 46, FIG. 19A to line 6, FIG. 19B. If "F" is an AND, its BDD can initially be a constant "1" (line 4, FIG. 19B) that is ANDed with the BDDs created (by recursive calls to BuildBdd) for each child of "F." If "F" is an OR, its BDD can initially be a constant "0" (line 6, FIG. 19B) that is ORed with the BDDs created (by recursive calls to BuildBdd) for each child of "F." Recursive calls to BuildBdd, for each child of "F," are handled by the "for" loop of lines 9-17, FIG. 19B.

If "F" has an output inversion, its BDD can be negated. Lines 19-20.

9.5. BreakEqClassWithWmc

FIG. 16 presents a pseudo-code procedure "BreakEqClassWithWmc." BreakEqClassWithWmc is similar to BreakEqClassWithOmc. Some of the differences are as follows. BreakEqClassWithWmc calls ChooseUniqueWeights to determine a set of weights $U_s$. Line 14. $U_s$ assigns a unique weight to each variable of $V_s$ that is to remain symbolic. $U_s$ is included as a parameter to FindMatchWithWmc. Line 24.

9.6. FindMatchWithWmc

FIG. 17 presents a pseudo-code procedure "FindMatchWithWmc." FindMatchWithWmc is passed an EC $EC_{one}$. Line 1. For each sub-design of $EC_{one}$ the parameter "BDD" of FindMatchWithWmc contains a corresponding BDD.

The new subdivisions of $EC_{one}$, that FindMatchWithWmc is able to find, are stored in NewEC which is initialized to an empty set. Line 3.

For each sub-design $D_i$ of $EC_{one}$ a "for" loop (line 4) cause the following to be done.

A nested "for" loop (line 7) iterates over each EC, called $EC_{cur}$, that is a member of NewEC. A representative sub-design "R," of $EC_{cur}$, is selected. Line 10. A test is performed, with CheckRelationsWithOmc, to determine if "R" can be distinguished from $D_i$ with OMC. Line 14. If "R" and $D_i$ can be distinguished, then the next EC of NewEC is tried. Lines 15-16. If "R" and $D_i$ appear to be the same, under OMC, then a test is performed, with CheckRelationsWithWmc, to determine if "R" can be distinguished from $D_i$ with WMC. Line 22. If "R" and $D_i$ can be distinguished, then the next EC of NewEC is tried. Lines 23-24. Otherwise, $D_i$ is added to $EC_{cur}$. Line 28.

CheckRelationsWithOmc can operate as follows. The OMC of "R" and $D_i$ can be compared. If they have the same value, a true can be returned. If they do not have the same value, the seven OMC exceptions can be applied. If, when any one of the seven OMC exceptions is applied, "R" and $D_i$ have the same value, a true can be returned. Otherwise, a false can be returned.

If CheckRelationsWithOmc returns a true, FindInputInversions can be applied (FIG. 17, line 19) prior to application of CheckRelationsWithWmc. FindInputInversions can identify any input inversions between "R" and $D_i$ and store such input inversions in "Inv."

CheckRelationsWithWmc can operate in the same way as CheckRelationsWithOmc, except for the following. The WMC of "R" and $D_i$ can be compared by utilizing the unique weight, contained in $U_s$, that is assigned to each symbolic variable. If they do not have the same value, seven WMC exceptions can be applied. Testing for certain of the exceptions can involve utilization of the input inversion information passed to CheckRelationsWithWmc in "Inv."

9.7. FindInputInversions

FIG. 18 presents a pseudo-code procedure "FindInputInversions." The input parameters to FindInputInversions (line 1) are as follows: a sub-design SD1, a sub-design SD2, a BDD "$BDD_{SD1}$," for SD1 and a BDD "$BDD_{SD2}$," for SD2.

TestedVars can be the set of all variables tested for whether, as a necessary-but-insufficient condition for equivalency between SD1 and SD2, input inversion is required. If a variable v1 of an SD1 and a variable v2 of an SD2 are identified as needing to be input inverted, this means that if SD1 and SD2 are to be equivalent to each other, then v1 and v2 must be input inversions of each other.

For all variables of $BDD_{SD1}$ and $BDD_{SD2}$ that are symbolic, whether a pair of variables between them needs to be input inverted, as a necessary-but-insufficient condition for equivalence between two sub-designs, can be tested for by "TestInputInversions." Line 7. As discussed above in section 4.2 ("Input Inversion"), TestInputInversions can use the technique of the J. Mohnke and S. Malik paper. A key difference in the operation of TestInputInversions, from the J. Mohnke and S. Malik paper, is that testing for input inversion is only done on the subset of variables currently symbolic.

The variables of $BDD_{SD1}$ and $BDD_{SD2}$ that are symbolic can be identified as the support of $BDD_{SD1}$ or $BDD_{SD2}$. The support of $BDD_{SD1}$ or $BDD_{SD2}$ can be added to TestedVars to indicate that these variables have been tested for input inversion. Line 10.

A "while" loop (lines 12-28) can be utilized by FindInputInversions to test for input inversion between all variables, of $BDD_{SD1}$ and $BDD_{SD2}$, that are assigned binary values. Each iteration of the "while" selects at least one variable, called "$var_{cur}$," for input inversion testing. Line 16. ChooseDirectedSymbolicVariables is called. Line 22. ChooseDirectedSymbolicVariables chooses a set of variables to remain symbolic, where the set of symbolic variables includes $var_{cur}$. The variables not chosen by ChooseDirectedSymbolicVariables, to remain symbolic, are assigned binary values. BDDs are built for each sub-design (lines 23-24) and TestInputInversions is executed. Each execution of TestInputInversions differs from the J. Mohnke and S. Malik paper by testing for input inversion with only a subset of the variables being symbolic.

10. Hardware Environment

Figure 20:
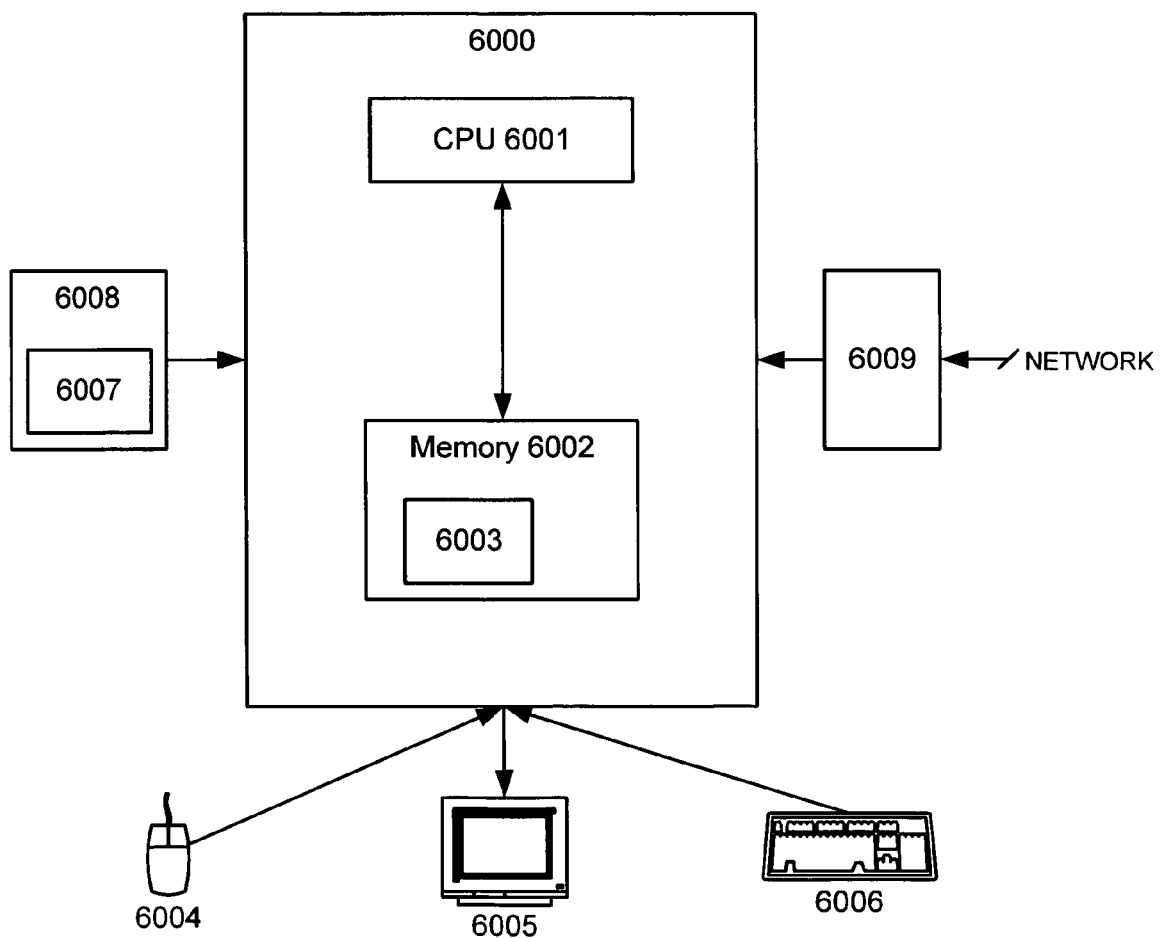
FIG. 20 presents a computing environment (or data processing system) within which the combinational design distinguishing architecture of the present invention can be executed.
Figure 21:
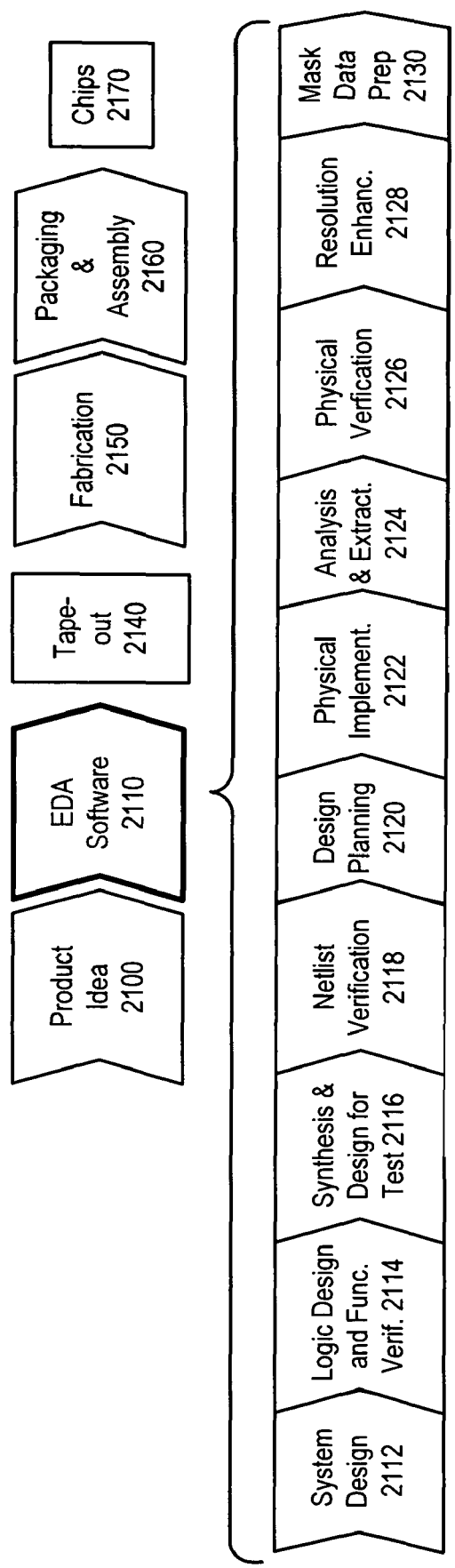
FIG. 21 shows a simplified representation of an exemplary digital ASIC design flow.

The combinational design distinguishing architecture of the present invention, or each of its component sub-systems individually, can be executed within a computing environment (or data processing system) such as that of FIG. 20. FIG. 20 depicts a workstation computer 6000 comprising a Central Processing Unit (CPU) 6001 (or other appropriate processor or processors) and a memory 6002. Memory 6002 has a region 6003 in which is stored the software tools (or computer programs) and data of the present invention. While 6003 is depicted as a single region, those of ordinary skill in the art will appreciate that, in fact, such software may be distributed over several memory regions or several computers. Furthermore, depending upon the computer's memory organization (such as virtual memory), memory 6002 may comprise several types of memory (including cache, random access memory, hard disk and networked file server). Computer 6000 can be equipped with a display monitor 6005, a mouse pointing device 6004 and a keyboard 6006 to provide interactivity between the software of the present invention and a chip designer. Computer 6000 also includes a way of reading computer readable instructions from a computer readable medium 6007, via a medium reader 6008, into the memory 6002. Computer 6000 also includes a way of reading computer readable instructions via the Internet (or other network) through network interface 6009.

In some embodiments, computer programs embodying the present invention are stored in a computer readable medium, e.g. CD-ROM or DVD. In other embodiments, the computer programs are embodied in an electromagnetic carrier wave. For example, the electromagnetic carrier wave may include the programs being accessed over a network.

11. Glossary of Selected Terms combinational design discriminator (CDD): a technique for determining whether first and second combinational designs are functionally different. Example CDDs are OMC and WMC.

combinational sub-design: without loss of generality, can be regarded as comprised of n input variables and one output variable. Can be referred to herein as D1 or D2.

EC: equivalence class.

The "J. Mohnke and S. Malik paper" is the following paper that is herein incorporated by reference in its entirety: J. Mohnke and S. Malik, "Permutation and phase independent Boolean comparison," In Proceedings of the European Conference on Design Automation, pages 86-92, February 1993.

Literal: a symbolic representation of a binary value assigned to a Boolean variable.

MC: refers to generic minterm counting, that can be OMC or WMC.

Pseudo-code: The pseudo-code presented herein is loosely based on the C programming language. The C programming language is described in such texts as "A Book on C," by A. Kelley and I. Pohl, Benjamin Cummings Pub. Co., Third Edition, 1995, ISBN 0-8053-1677-9, herein incorporated by reference in its entirety. In pseudo-code procedure calls, a parameter is prefixed with the "&" operator to indicate that the called procedure will operate on the data object of the calling procedure. This use of the "&" operator is a standard part of the C programming language.

OMC: ordinary minterm counting.

support of a sub-design: the set of input variables, to a sub-design, that are symbolic and have not been assigned a particular binary value.

WMC: weighted minterm counting.

While the invention has been described in conjunction with specific embodiments, it is evident that many alternatives, modifications and variations will be apparent to those skilled in the art in light of the foregoing description. Accordingly, it is intended to embrace all such alternatives, modifications and variations as fall within the spirit and scope of the appended claims and equivalents.

What is claimed is:

1. A computer-implemented method for determining whether a first and a second design are functionally different, comprising:

producing, by at least one computer, a first data structure from the first design, representative of a first set of minterms, wherein the first set of minterms defines a functionality of the first design;

producing, by at least one computer, a second data structure from the second design, representative of a second set of minterms, wherein the second set of minterms defines a functionality of the second design;

assigning, by at least one computer, a first weighted minterm count to the first data structure, which involves evaluating expressions in which weights are assigned to the first set of minterms with a variable level weighting function, a minterm level weighting function and a design level weighting function, wherein the variable level weighting function assigns a weight to a variable of a minterm, wherein the minterm level weighting function assigns a weight to a minterm based at least on weights assigned to variables of the minterm, and wherein the design level weighting function assigns a weight to a combinational sub-design;

assigning, by at least one computer, a second weighted minterm count to the second data structure, which involves evaluating expressions in which weights are assigned to the second set of minterms with the variable level weighting function, the minterm level weighting function and the design level weighting function; and deciding, by at least one computer, the first and second designs are functionally different in response to determining that the first weighted minterm count is not within a first tolerance of the second weighted minterm count.

2. The computer-implemented method of claim 1, wherein the variable level weighting function assigns a weight to each literal of each minterm based upon a variable represented by a literal and a value for the variable required by the literal.

3. The computer-implemented method of claim 2, wherein the variable level weighting function assigns a unique weight to each variable.

4. The computer-implemented method of claim 2, wherein the variable level weighting function assigns, to each variable, a weight close to one.

5. The computer-implemented method of claim 1, wherein the minterm level weighting function is multiplication.

6. The computer-implemented method of claim 1, wherein the first tolerance amount is zero.

7. The computer-implemented method of claim 1, wherein the first and second data structures are binary decision diagrams.

8. The computer-implemented method of claim 7, wherein the step of assigning a first weighted minterm count further comprises:
 determining a "then" weighted minterm count for a "then" input to a parent node;
 determining an "else" weighted minterm count for an "else" input to the parent node; and
 determining a parent node weighted minterm count by applying the "then" and "else" weighted minterm counts to a combining expression.

9. The computer-implemented method of claim 8, wherein the step of determining a parent node weighted minterm count further comprises:
 determining a parent weight, for the parent node, based upon a variable represented by the parent node.

10. The computer-implemented method of claim 9, wherein the step of determining a parent node weighted minterm count further comprises:
 multiplying the parent weight by the "then" weighted minterm count to produce a first product;
 adding the first product to the "else" weighted minterm count to produce a first sum; and
 dividing the first sum by two.

11. The computer-implemented method of claim 8, wherein the step of determining a "then" weighted minterm count further comprises:
 determining a parent variable represented by the parent node; and
 determining an adjustment factor depending upon the parent variable.

12. The computer-implemented method of claim 8, wherein the step of determining a "then" weighted minterm count further comprises:
 determining a parent variable represented by the parent node;
 determining a "then" variable represented by a "then" node coupled to the "then" input to the parent node;
 determining an adjustment factor depending upon the parent variable and the "then" variable; and
 determining a "then" node weighted minterm count for the "then" node.

13. The computer-implemented method of claim 8, wherein the step of determining an "else" weighted minterm count further comprises:
 producing a value of zero.

14. The computer-implemented method of claim 8, wherein the step of determining an "else" weighted minterm count further comprises:
 determining a parent variable represented by the parent node; and
 determining an adjustment factor depending upon the parent variable.

15. The computer-implemented method of claim 8, wherein the step of determining an "else" weighted minterm count further comprises:
 determining a parent variable represented by the parent node;
 determining an "else" variable represented by an "else" node coupled to the "else" input to the parent node;
 determining a first adjustment factor depending upon the parent variable and the "else" variable; and
 determining an "else" node weighted minterm count for the "else" node.

16. The computer-implemented method of claim 15, further comprising:
 determining a second adjustment factor depending upon the parent variable.

17. The computer-implemented method of claim 1, wherein the step of deciding further comprises:
 evaluating an exception if it is decided that the first and second designs are functionally different; and
 overriding a decision, that the first and second designs are functionally different, if the exception is evaluated to apply.

18. The computer-implemented method of claim 17, wherein the step of evaluating an exception further comprises:
 determining a third weighted minterm count, that is equivalent to assigning a weight to a third set of minterms with a variable level weighting function, a minterm level weighting function and a design level weighting function, wherein the third set of minterms can determine an inverse functionality of the second design, and wherein determining an exception applies if the third weighted minterm count is within a tolerance amount of the first weighted minterm count.

19. The computer-implemented method of claim 18, wherein the step of determining a third weighted minterm count further comprises:
 determining a fourth weighted minterm count, for a function of a same number of variables as the second design, that represents a constant one; and
 determining the third weighted minterm count as a difference between the fourth and second weighted minterm counts.

20. The computer-implemented method of claim 19, wherein the step of determining a fourth weighted minterm count further comprises:
- determining a second ordinary minterm count, for a function of a same number of variables as the second design, that represents a constant one;
- determining a first product of an adjusted weight for each variable of the second design; and
- determining the fourth weighted minterm as a second product of the second ordinary minterm count and the first product.

21. The computer-implemented method of claim 17, wherein the step of evaluating an exception further comprises:
- determining whether, as a necessary but insufficient condition of equivalence between the first and second designs, a first set of variables, between the first and second designs, needs to be inverted; and
- determining whether, with weighted minterm counting, each variable of the first set of variables is consistent with being input inverted between the first and second designs.

22. The computer-implemented method of claim 21, wherein the step of determining with weighted minterm counting, for each variable of the first set of variables, further comprises:
- determining whether a third weighted minterm count, of the first design co factored with respect to a first variable, is within a first tolerance of a fourth weighted minterm count, of the second design co factored with respect to a negation of the first variable, wherein the fourth weighted minterm count is phase shifted for each variable of the first set of variables; and
- determining whether a fifth weighted minterm count, of the first design co factored with respect to the negation of the first variable, is within a first tolerance of a sixth weighted minterm count, of the second design co factored with respect to the first variable, wherein the sixth weighted minterm count is phase shifted for each variable of the first set of variables.

23. A data processing system for determining whether a first and second designs are functionally different, comprising the following sub systems:
- a sub system configured to accomplish producing a first data structure from the first design, representative of a first set of minterms, wherein the first set of minterms defines a functionality of the first design;
- a sub system configured to accomplish producing a second data structure from the second design, representative of a second set of minterms, wherein the second set of minterms defines a functionality of the second design;
- a sub system configured to accomplish assigning a first weighted minterm count to the first data structure, which involves evaluating expressions in which weights are assigned the first set of minterms with a variable level weighting function, a minterm level weighting function and a design level weighting function, wherein the variable level weighting function assigns a weight to a variable of a minterm, wherein the minterm level weighting function assigns a total weight to a minterm based at least on weights assigned to variables of the minterm, and wherein the design level weighting function assigns a total weight to a combinational sub-design;
- a sub system configured to accomplish assigning a second weighted minterm count to the second data structure, which involves evaluating expressions in which weights are assigned to the second set of minterms with the variable level weighting function, the minterm level weighting function and the design level weighting function;
- a sub system configured to accomplish deciding the first and second designs are functionally different in response to determining that the first weighted minterm count is not within a first tolerance of the second weighted minterm count.

24. A non-transitory computer readable storage medium storing instructions that when executed by a computer cause the computer to perform a method for determining whether a first and second designs are functionally different, the method comprising:
- producing a first data structure from the first design, representative of a first set of minterms, wherein the first set of minterms defines a functionality of the first design;
- producing a second data structure from the second design, representative of a second set of minterms, wherein the second set of minterms defines a functionality of the second design;
- assigning a first weighted minterm count to the first data structure, which involves evaluating expressions in which weights are assigned to the first set of minterms with a variable level weighting function, a minterm level weighting function and a design level weighting function, wherein the variable level weighting function assigns a weight to a variable of a minterm, wherein the minterm level weighting function assigns a total weight to a minterm based at least on weights assigned to variables of the minterm, and wherein the design level weighting function assigns a total weight to a combinational sub-design;
- assigning a second weighted minterm count to the second data structure, which involves evaluating expressions in which weights are assigned to the second set of minterms with the variable level weighting function, the minterm level weighting function and the design level weighting function;
- deciding the first and second designs are functionally different in response to determining that the first weighted minterm count is not within a first tolerance of the second weighted minterm count.

* * * * *